United States Patent [19]
Satoh

[11] Patent Number: 6,128,412
[45] Date of Patent: Oct. 3, 2000

[54] STATISTICAL DATA COMPRESSION/ DECOMPRESSION METHOD

[75] Inventor: Noriko Satoh, Kawasaki, Japan

[73] Assignee: Fujitsu Limited, Kawasaki, Japan

[21] Appl. No.: 08/828,558

[22] Filed: Mar. 31, 1997

[30] Foreign Application Priority Data

Sep. 2, 1996 [JP] Japan .................................. 8-231867

[51] Int. Cl.[7] .................................................... G06K 9/36
[52] U.S. Cl. ......................... 382/246; 382/228; 382/229
[58] Field of Search .................................. 382/246, 240, 382/229, 228, 245

[56] References Cited

U.S. PATENT DOCUMENTS

| | | | |
|---|---|---|---|
| 4,862,167 | 8/1989 | Copeland, III | 341/107 |
| 5,150,119 | 9/1992 | Yoshida et al. | 341/51 |
| 5,254,990 | 10/1993 | Yoshida et al. | 341/51 |
| 5,506,580 | 4/1996 | Whiting et al. | 341/51 |
| 5,635,932 | 6/1997 | Shinagawa et al. | 341/51 |
| 5,650,783 | 7/1997 | Murashita et al. | 341/107 |
| 5,710,562 | 1/1998 | Gormish et al. | 341/107 |

FOREIGN PATENT DOCUMENTS 09246991  9/1997  Japan .

*Primary Examiner*—Christopher S. Kelley
*Assistant Examiner*—Kanji Patel
*Attorney, Agent, or Firm*—Staas & Halsey LLP

[57] ABSTRACT

Provided is a probabilistic statistical data compression/ restoration method for variable-length encoding a source character and restoring a variable-length code to a character using the probability of occurrence of the source character which appears following a character string (context) of n characters which immediately precede the source character. When variable-length encoding is performed, a context registration unit successively registers context based upon an entered character without fixing the length (degree) of context, and a compressing encoder selects registered context satisfying a predetermined condition, e.g., registered context for which the frequency of occurrence is greater than a fixed value, as context (encoding context) used in encoding, and variable-length encodes a source character by using this encoding context. A restoration unit restores a code to a character by executing processing which is the reverse of the processing executed by the compressing encoder.

15 Claims, 25 Drawing Sheets

| CHARACTER | PROBABILITY OF OCCURRENCE | INTERVAL |
|---|---|---|
| a | 0.20 | [0, 0.2) |
| b | 0.10 | [0.2, 0.3) |
| c | 0.05 | [0.3, 0.35) |
| d | 0.15 | [0.35, 0.5) |
| e | 0.50 | [0.5, 1) |

(AFTER INPUT OF cacbcaaabca)

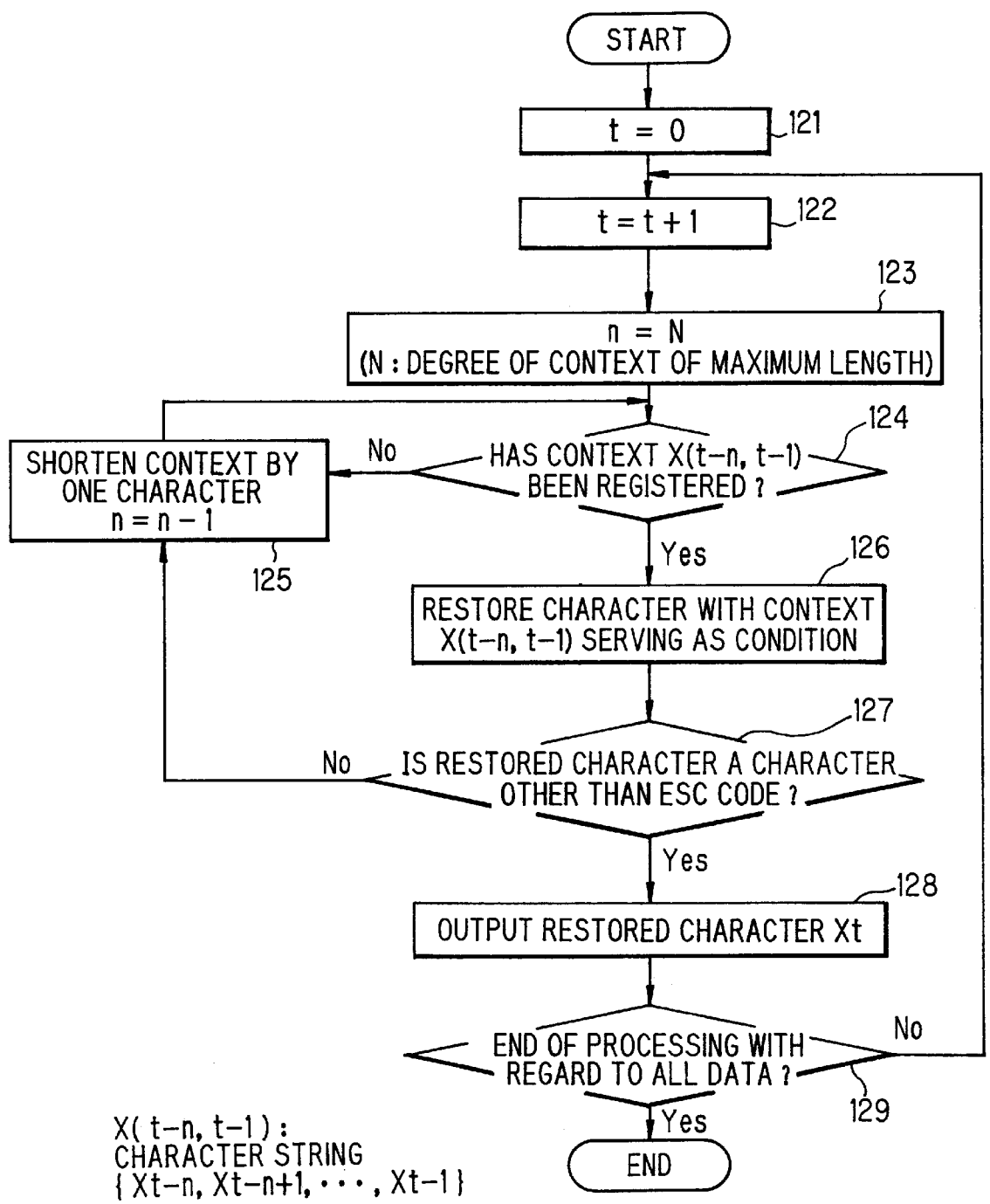

STATISTICAL DATA COMPRESSION/ DECOMPRESSION METHOD

BACKGROUND OF THE INVENTION

This invention relates to a statistical data compression/ decompression method and, more particularly, to a statistical data compression/restoration method for variable-length encoding of a source character using the probability that the source character will appear following a previous character string (context) of n characters or for decoding of such a variable-length code to a character.

The rapid progress that has recently been made in the development of computers has been accompanied by the need to handle large quantities of data within computers. These data are compressed to shorten transmission time or utilize memory more efficiently.

Various coding methods for compressing data are known. One of these methods is coding that can be adapted to a variety of data, i.e., coding that is not limited to data such as character codes, vector information and images. Such coding is referred to as "universal coding." Example of universal coding are dictionary coding, which utilizes the similarity of character strings, and statistical coding, which utilizes the frequency of appearance of characters. In the discussion that follows, which is based upon information theory, one unit of a word of data shall be referred to as a "character" and a series of any of such word units shall be referred to as a "character string".

Statistical compression is a method which, in accordance with the statistical frequency of appearance (probability of appearance) of compressed data, obtains compressed data by assigning short code lengths to characters having a high probability of appearance. Typical examples of statistical coding are (1) arithmetic coding (e.g., "Arithmetic Coding for Data Compression", by Ian H. Witten, et al., Commun. of ACM Vol. 130, No. 6P, 520–540, or "An Adaptive Dependence Source Model for Data Compression Scheme", by D. M. Abrahamson, Commun. of ACM Vol. 132 No. 1, P77–82), and (2) Huffman coding (e.g., "Dynamic Huffman Coding", by Donald E. Knuth, Journal of Algorithms, Vol. 6, P163–180).

In Huffman coding, a code (the Huffman code) is used as the code of each character, where the Huffman code has a code length that is inversely proportional to the frequency of appearance of the character. Before the details of Huffman coding are discussed, a code tree, which is the structure of data used when a Huffman code is generated, will be described.

FIG. 18 shows an example of a Huffman tree. The points indicated by the circles and squares are nodes. The segments connecting nodes are referred to as "branches" and the node located at the uppermost position is referred to as a "root". An underlying mode Y connected to a certain node X is referred to as the "child" of the node X. Conversely, the node X is referred to as the "parent" of the node Y. A node that does not have a "child" is referred to as a "leaf". Each leaf has a character corresponding to it. Nodes other than "leaves" are referred to as "internal nodes". The number of branches from the "root" to a node is referred to as the "level" of that node.

When encoding is performed using a code tree, the path from the "root" to the "leaf" correlated with the character to be encoded is outputted as a code. More specifically, "1" is outputted when the path branches to the left of each node from the "root" to the target "leaf", and "0" is outputted when the path branches to the right of each node from the "root" to the target "leaf." For example, in the code tree illustrated in FIG. 18, the code "00" is outputted for the character A, which has been correlated with the "leaf" of node number 7, and the code "011" is outputted for the character B, which has been correlated with the "leaf" of node number 8. At decoding, the character outputted is that correlated with the "leaf" reached when nodes are traced in reverse in accordance with the value of each bit of data to be decoded.

In accordance with Huffman coding, a code tree of the above-mentioned kind is generated through the following procedure (referred to as the "Huffman algorithm") (see FIG. 19).

(1) A node (a leaf initially) corresponding to each character is prepared and the frequency of appearance of the corresponding character is recorded in advance for each node.

(2) One new node is created for two nodes having the lowest frequency of appearance, and the node created is connected to the two original nodes by branches. The sum of the frequencies of appearance of the two original nodes connected to the new node by the branches is recorded as the frequency of appearance of this newly created node.

(3) One new node is created for two nodes having the next lowest frequency of appearance, and the node created is connected to the two original nodes by branches. The sum of the frequencies of appearance of the two original nodes connected to the new node by the branches is recorded as the frequency of appearance of this newly created node. Step (3) is continued until there are no longer any nodes having a parent.

In the code tree generated through this procedure, each character is assigned a code having a code length that is inversely proportional to the frequency of appearance of this character. If encoding is performed using this code tree, therefore, the data will be compressed. There are two kinds of Huffman coding: static, in which the Huffman tree is fixed, and adaptive, in which the coding tree is modified in conformity with the frequency of appearance of each character.

When one character is encoded in accordance with the Huffman coding scheme, a code comprising a whole-number of bits is generated. With arithmetic coding, on the other hand, a fractional number of bits can be assigned to one character. In arithmetic coding, an interval [indicated by (0,1) below] of values greater than 0 but less than 1 grows successively narrower in conformity with the probability of occurrence (frequency of appearance) of each character constituting the source data to be encoded. When the processing of all pixels is finished, a numerical value representing one point in the narrowed interval is outputted as the code.

By way of example, assume that characters to be encoded are the five characters a, b, c, d and e, and that the probabilities that these characters will occur are 0.2, 0.1, 0.05, 0.15 and 0.5, respectively. In such case, intervals having interval widths conforming to these probabilities of occurrence are assigned to the respective characters, as shown in FIG. 20. If a source character string to be encoded is "abe", then the interval (0,1) is first narrowed to the interval (0,0.2) with regard to the character "a", as shown schematically in FIG. 21. Next, the interval (0,0.2) is partitioned into intervals conforming to the probabilities of occurrence of each of the characters, and the interval (0.04, 0.06), which corresponds to the next character "b", is selected as the interval of the character string "ab". This interval (0.04,0.06) is then partitioned into intervals conforming to the probabilities of occurrence of each of the characters, and the interval (0.05,0.06), which corresponds to the next character "e", is selected as the interval of the character string "abe". Finally, a sequence of bits below the decimal point obtained when the position of any point (e.g., the lower limit) in this interval is expressed by a binary number is outputted as the encoded result.

In order to achieve better compression with probabilistic statistical coding, the probability of occurrence of each character is obtained in correlation with a character string (context) that has appeared immediately prior to the source character to be encoded. In this case, as shown in FIG. 22, encoding is implemented by an apparatus having a context acquisition unit (context registration unit) 1 and a variable-length encoder 2. The context acquisition unit 1 stores a character string (context) that has appeared and counts the number of these appearances using a context tree of the kind shown in FIG. 23, and obtains a conditional probability of appearance (referred to simply as "probability of appearance" below), which indicates the probability that each character will appear after a certain context. The variable-length encoder 2 generates a code having a length conforming to the probability of appearance obtained by the context acquisition unit 1. It should be noted that when a code is generated, the variable-length encoder 2 uses the probability of appearance that prevailed prior to updating.

By way of example, assume that the context "abc" has not yet been registered (but that the context "ab" has been registered) in FIG. 23. If the source character "c", namely the character to be encoded, has been entered following "ab" under these circumstances, as shown in FIG. 24, the variable-length encoder 2 checks to see whether the context "abc" has been registered or not. Since "abc" has not yet been registered in this case, the variable-length encoder 2 checks to determine whether the context "bc", which is smaller by one character, has been registered. Since the context "bc" has been registered, the variable-length encoder 2 uses the probability P(c/b) of appearance of "bc" to encode the source character "c" by means of arithmetic coding. Further, the context acquisition unit 1 re-calculates and stores the probability P(c/b) of appearance of the context "bc", connects the source character "c" with the context "ab" and then calculates and stores the probability P(c|a,b) of appearance that the source character "c" will appear following the context "ab". When the source character "c" subsequently reappears following "ab", the variable-length encoder 2 uses the probability P(c|a,b) of appearance of the context "abc" to encode the source character "c" by arithmetic coding, re-calculates the probability P(c|a,b) of appearance of the context "abc" and stores the same. Similar processing is then executed to register context and perform variable-length coding using the context registered.

Methods shown in FIGS. 25A, 25B can be used as context-tree registration methods. A context tree may be registered using either method. Neither need possess a tree structure, as in the manner of a hash table or the like. In FIGS. 25A and 25B, a context tree is constructed by successively registering secondary context comprising two characters immediately preceding the source character and the source character. FIG. 25A illustrates a context tree in which the first character of secondary context is connected to the "root" in a case where the character string "cacbcaaabca" has been entered, and FIG. 25B illustrates a context tree in which the last character of secondary context is connected to the "root" in a case where the character string "cacbcaaabca" has been entered.

There are a variety of specific processing procedures that can be used in processing for registering context. These can be broadly divided into procedures in which the degree of context (the number of characters of context) is fixed and procedures in which the degree of context is not fixed (blended context). (For example, see "Modeling for Text Compression", by Timothy Bell et al., ACM Computing Surveys, Vol. 21, No. 4).

A method of fixing the degree of context involves fixing the length (degree) of context that obtains a conditional probability of appearance. If the degree is degree 2, for example, the method involves registering context of degree 2, in which a source character is connected to the two immediately preceding characters, calculating the conditional probability of appearance $p(X_t|X_{t-2},X_{t-1})$ of this context of degree 2 and then storing the same, where $X_t$ represents the source character, and $X_{t-1}$, $X_{t-2}$ respectively represent the immediately preceding first and second characters.

Blending contexts (blending degrees in a blended model) is a method of extending the degree of registered context in dependence upon entered data without fixing the degree of context. The sequential registration method is known as a method of extending the degree of registered context. FIG. 26 is a diagram for describing a context tree registered by the sequential registration method in a case where the character string "cacbcaaabca" has been entered. The characters a, b, c initially are connected to "root", and the probabilities of appearance thereof initially are set.

(1) If the first character "c" is entered under these conditions, the probability of appearance of "c" is encoded and outputted and the probability of appearance of "c" is updated.

(2) If the second character "a" is entered, the probability of appearance of "a" is encoded and outputted and the probability of appearance of "a" is updated because the context (ca) that can be used in the encoding of "a" has not yet been registered. Further, the character "a" is connected under the immediately preceding character "c" and the context "ca" is registered.

(3) If the third character "c" is entered, the probability of appearance of "c" is encoded and outputted and the probability of appearance of "c" is updated because the context (cac, ac) that can be used in the encoding of "c" has not yet been registered. Further, the character "c" is connected under the immediately preceding character "a" and the context "ac" is registered.

(4) If the fourth character "b" is entered, the probability of appearance of "b" is encoded and outputted and the probability of appearance of "b" is updated because the context (cac, acb, cb) that can be used in the encoding of "b" has not yet been registered. Further, the character "b" is connected under the immediately preceding character "c" and the context "cb" is registered.

(5) If the fifth character " c" is entered, the probability of appearance of "c" is encoded and outputted and the probability of appearance of "c" is updated because the context (cacbc, acbc, cbc, bc) that can be used in the encoding of "c" has not yet been registered. Further, the character "c" is connected under the immediately preceding character "b" and the context "bc" is registered.

(6) If the sixth character "a" is entered, the probability p(a/c) of appearance of context "ca" is encoded and outputted and the probability of appearance of context "ca" is updated because the context "ca" that can be used in encoding has been registered. Further, the context "ca" is connected under the immediately preceding character "b" of the above-mentioned context and the context "bca" is registered. Thereafter, and in similar fashion, this method of sequential registration is used to extend context one degree at a time whenever a character is entered.

FIG. 27 is a diagram for describing the sequential registration method in a case where the character string "FUJITSU" has been entered three consecutive times. Each of the characters F, U, J, I, T, S, U has been initially registered as encoding context (context of degree 0) [see (a) in FIG. 27]. If the initial character string "FUJITSU" is entered under these conditions, the following contexts are registered, as indicated at (b) in FIG. 27:

F
FU
UJ
JI
IT
TS
SU

If the next character string "FUJITSU" is entered under these conditions, encoding is performed with the registered contexts of (b) serving as the encoding contexts. Further, the following contexts are registered, in the manner indicated at (d):

F
FU
FUJ
UJI
JIT
ITS
TSU

If the next character string "FUJITSU" is entered under these conditions, encoding is performed with the registered contexts of (d) serving as the encoding context. Further, the following contexts are registered, as indicated at (e):

F
FU
FUJ
FUJI
UJIT
JITS
ITSU

Thereafter, and in similar fashion, context is extended in accordance with sequential registration one degree at a time whenever a character is entered.

FIG. 28 is a processing flowchart illustrating a blended model compression method according to the prior art.

The first step in FIG. 28 is to initialize a character number t to 0 (step 101). The character number t is then incremented and a character Xt, which is the t-th character, is entered (step 102). The degree n is then made the degree N of context of maximum length (step 103).

This is followed by step 104, at which it is determined whether the context $X(t-n,t-1)$ has been registered in a context tree. It should be noted that the context $X(t-n,t-1)$ is a character string $\{Xt-n, Xt-n+1, \ldots, Xt-1\}$. If the context $X(t-n,t-1)$ has not been registered, the degree n is decremented (step 105) and it is determined whether context shortened by one character has been registered (step 104).

If the context $X(t-n,t-1)$ has been registered, it is determined whether a combination of the context $X(t-n,t-1)$ and a source character Xt to be encoded is present in the context tree (step 106). If the combination is not present in the context tree, an escape code (ESC code) that follows the context $X(t-n,t-1)$ is encoded and outputted (step 107), after which processing from step 105 onward is repeated.

If the combination of the context $X(t-n,t-1)$ and a source character Xt is present in the context tree, then the character Xt is encoded and outputted using the probability that the source character Xt will appear following the context $X(t-n, t-1)$ (step 108). It is then determined whether the encoding of all data is finished (step 109). If encoding is not finished, the program returns to step 102 so that the above-described processing is repeated with regard to the next source character. It should be noted that processing for sequential registration of the context tree is carried out in parallel with above-described compressive encoding processing.

FIG. 29 is a processing flowchart illustrating a blended model restoration method according to the prior art.

The first step in FIG. 29 is to initialize the character number t to 0 (step 121). The character number t is then incremented (step 122) and the degree n is then made the degree N of context of maximum length (step 123).

This is followed by step 124, at which it is determined whether the context $X(t-n,t-1)$ has been registered in a context tree. It should be noted that the context $X(t-n,t-1)$ is n-number of the latest character strings $\{Xt-n, Xt-n+1, \ldots, Xt-1\}$ already restored. If the context $X(t-n,t-1)$ has not been registered, the degree n is decremented (step 125) and it is determined whether context shortened by a character has been registered (step 124). If the context $X(t-n,t-1)$ has been registered, the t-th code is restored to a character code with the context $X(t-n, t-1)$ serving as the condition (step 126).

Next, it is determined whether the restored character code is an ESC code (step 127). If the character code is the ESC code, then processing from step 125 onward is repeated. If the character code is not the ESC code, on the other hand, the restored character code is outputted (step 128). After the character code is outputted, it is determined whether reproduction processing is finished with regard to all data (step 129). If processing is not finished, the program returns to step 122 and the above-described processing is repeated for the next code. It should be noted that processing for sequential registration of the context tree is carried out in parallel with above-described restoration processing.

Thus, in data compression/restoration according to the blended model, a conditional probability of appearance (or the code per se) of each character is stored, inclusive of an ESC code indicating that registration is unfinished, for each and every context, and codes are outputted while degree of context is decremented one at a time until the character is compressed. Similarly, at the time of restoration, character codes are restored while degree is decremented one at a time until the character code is restored.

When context is lengthened (i.e., when the degree of context is enlarged) in a blended model, the following drawbacks arise:

(1) The number of times each context appears diminishes. This leads to a systematic error.
(2) The number of context variations increases. Registering all of these variations is impossible in terms of memory.
(3) Searching for context takes time.

With the conventional blended model, therefore, there are limitations in terms of improving compression/restoration speed and compression ratio and in terms of utilizing memory effectively.

SUMMARY OF THE INVENTION

Accordingly, a first object of the present invention is to measure the correlation of context, carefully select only effective context exhibiting strong correlation, and using this context as encoding context, thereby making it possible to avoid using meaninglessly long context as encoding context, to simplify encoding (i.e., raising compression/restoration speed) and to improve compression ratio.

A second object of the invention is to carefully select and register only effective context exhibiting strong correlation, thereby making it possible to avoid registering meaninglessly long context as encoding context, to simplify encoding (i.e., raising compression/restoration speed) and to improve compression ratio.

A third object of the invention is to encode a character string having strong correlation not one character at a time but on a per character string basis, thereby raising compression/restoration speed and improving encoding efficiency.

A fourth object of the invention is to limit the search range of encoding context to effective context having strong correlation and to avoid using meaninglessly long context as encoding context, to simplify encoding and to improve encoding efficiency.

In accordance with the present invention, the first object is attained by providing a statistical data compression method for storing a character string (context) as well as probability of occurrence of a character which appears following this context, and encoding a character to variable-length code using the probability, comprising the steps of (1) extending the length (degree) of context based upon entered source characters, and storing the context as well as the probability of occurrence of said context, (2) selecting stored context satisfying a predetermined condition, and (3) encoding a character using the probability of occurrence of the character following the selected context.

In accordance with the present invention, the first object is attained by providing a statistical data decompression method for storing a character string (context) as well as probability of occurrence of a character which appears following this context, and decoding a variable-length code to a character using the probability, comprising the steps of (1) extending the length (degree) of context based upon decoded characters, and storing the context as well as the probability of occurrence of said context, (2) selecting stored context satisfying a predetermined condition, and (3) decoding a variable-length code to a character using the probability of occurrence of the character following the selected context.

In accordance with the present invention, the second object is attained by providing a statistical data compression method for storing a character string (context) as well as probability of occurrence of a character which appears following this context, and encoding a character to variable-length code using the probability, comprising the steps of (1) deciding context to be stored, based upon the context that was used in encoding of a previous character, (2) storing the context as well as probability of occurrence of a character which appears following the context, (3) selecting prescribed stored context as context used in encoding of an character, and (4) encoding the character using the probability of occurrence of the character following the selected context.

In accordance with the present invention, the second object is attained by providing a statistical data decompression method for storing a character string (context) as well as probability of occurrence of a character which appears following this context, and decoding a variable-length code to a character using the probability, comprising the steps of (1) deciding context to be stored, based upon context that was used in decoding of a variable-length code to a previous character, (2) storing the context as well as probability of occurrence of a character which appears following the context, (3) selecting prescribed stored context as context used in decoding of a variable-length code, and (4) decoding the variable-length code to a character using the probability of occurrence of the character following the selected context.

In accordance with the present invention, the third object is attained by providing a statistical data compression method for storing a character string (context) as well as probability of occurrence of a character which appears following this context, and encoding a character to variable-length code using the probability, comprising the steps of (1) limiting search range of context, which is used to encode previous character, and (2) selecting, from said search range, context used to encode the target character.

In accordance with the present invention, the third object is attained by providing a statistical data decompression method for storing a character string (context) as well as probability of occurrence of a character which appears following this context, and decoding a variable-length code to a character using the probability, comprising the steps of (1) limiting search range of context, which is used to decode previous character, and (2) selecting, from said search range, context used to decode a target character.

In summary, therefore, context exhibiting strong correlation is utilized in encoding. Further, context exhibiting pseudo-strong correlation is utilized in encoding and registration by employing encoding context of a character preceding (immediately preceding, preceding by one, preceding by two, . . . ) a source character. Further, a character string exhibiting strong correlation is not encoded one character at a time; rather, encoding is performed by regarding the character string as a single character. In addition, the search range of the encoding context of a source character is decided by the encoding context of a character preceding the source character.

Other features and advantages of the present invention will be apparent from the following description taken in conjunction with the accompanying drawings.

BRIEF DESCRIPTION OF THE DRAWINGS

FIG. 29 illustrates a conventional blended model (restoration method).

DESCRIPTION OF THE PREFERRED EMBODIMENTS (A) Overall Configuration

Figure 1A:
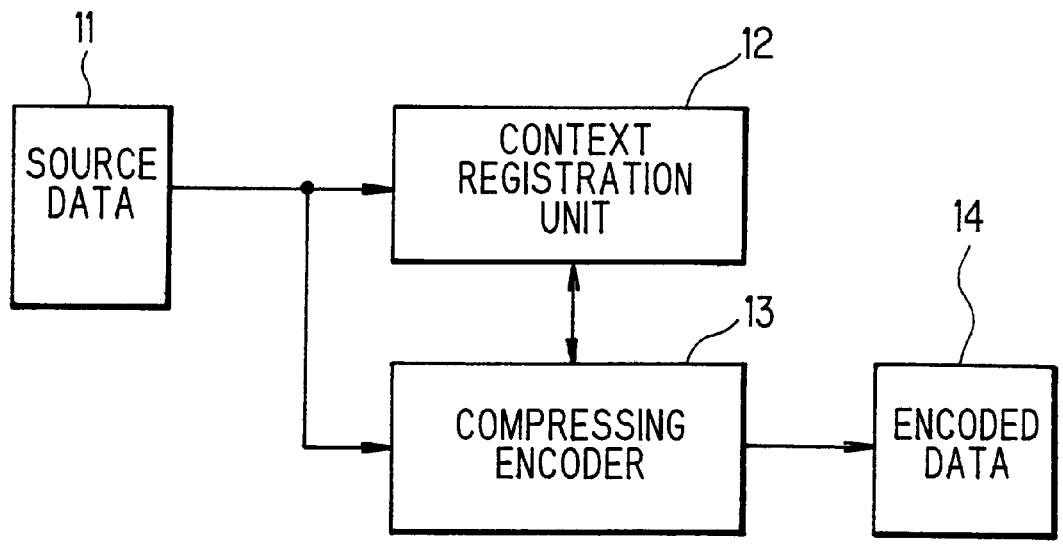
FIGS. 1A and 1B are diagrams illustrating the configurations of data compression and restoration apparatus, respectively.
Figure 1B:
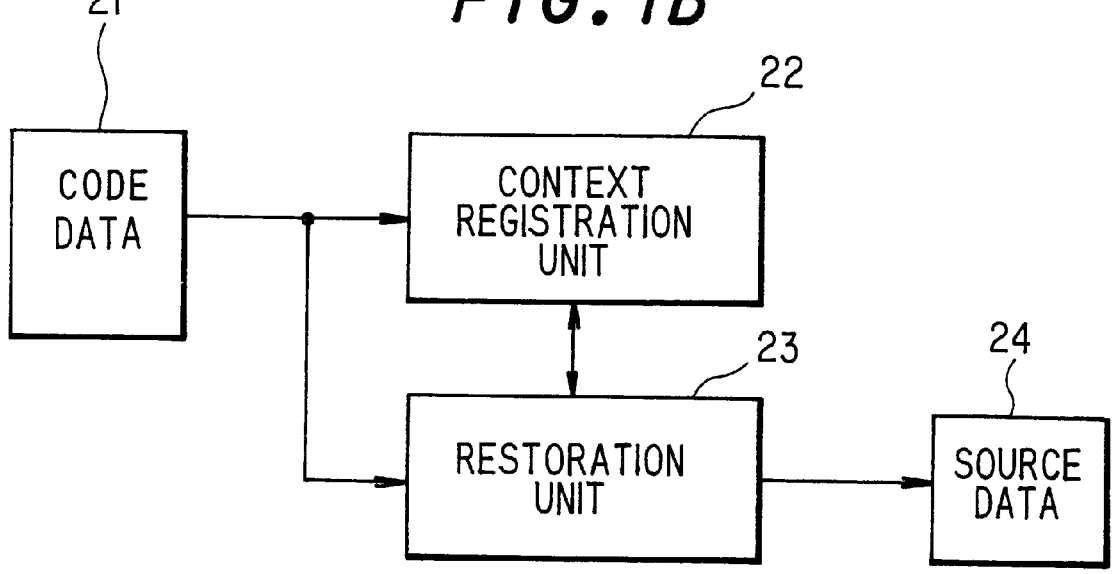

FIGS. 1A and 1B are diagrams illustrating the configurations of data compression and restoration apparatus, respectively. Though each diagram is illustrated in the form of a functional block diagram, each apparatus is actually constituted by a computer having a processor, an internal memory (ROM, RAM), data input/output units and an external memory, etc.

The data compression apparatus in FIG. 1A includes character string input means 11, a context registration unit 12 for extending and registering the degree of context in conformity with an input character string, a compressing encoder 13 for variable-length encoding of source characters using registered context, and an encoded data output unit 14 for outputting encoded data. The context registration unit 12 expresses context by a tree structure (a context tree) and, whenever a character string passes through the character of each node of the tree, counts the number of appearances of this character string at each node, thereby obtaining the probability of appearance and storing the same. The compressing encoder 13 subjects a source character to variable-length encoding using probability of appearance.

The data restoration apparatus in FIG. 1B includes encoded data input means 21, a context registration unit 22 for extending and registering the degree of context in conformity with a restoration character string, a restoration unit (decompression unit) 23 for restoring encoded data to a character code using registered context, and a character code output unit 24 for outputting a restored character string. The context registration unit 22 expresses context by a tree structure (a context tree) and, whenever a character string passes through the character of each node of the tree, counts the number of appearances of this character string at each node, thereby obtaining the probability of appearance and storing the same. The restoration unit 23 restores encoded data to source data using probability of appearance.

Figure 2:
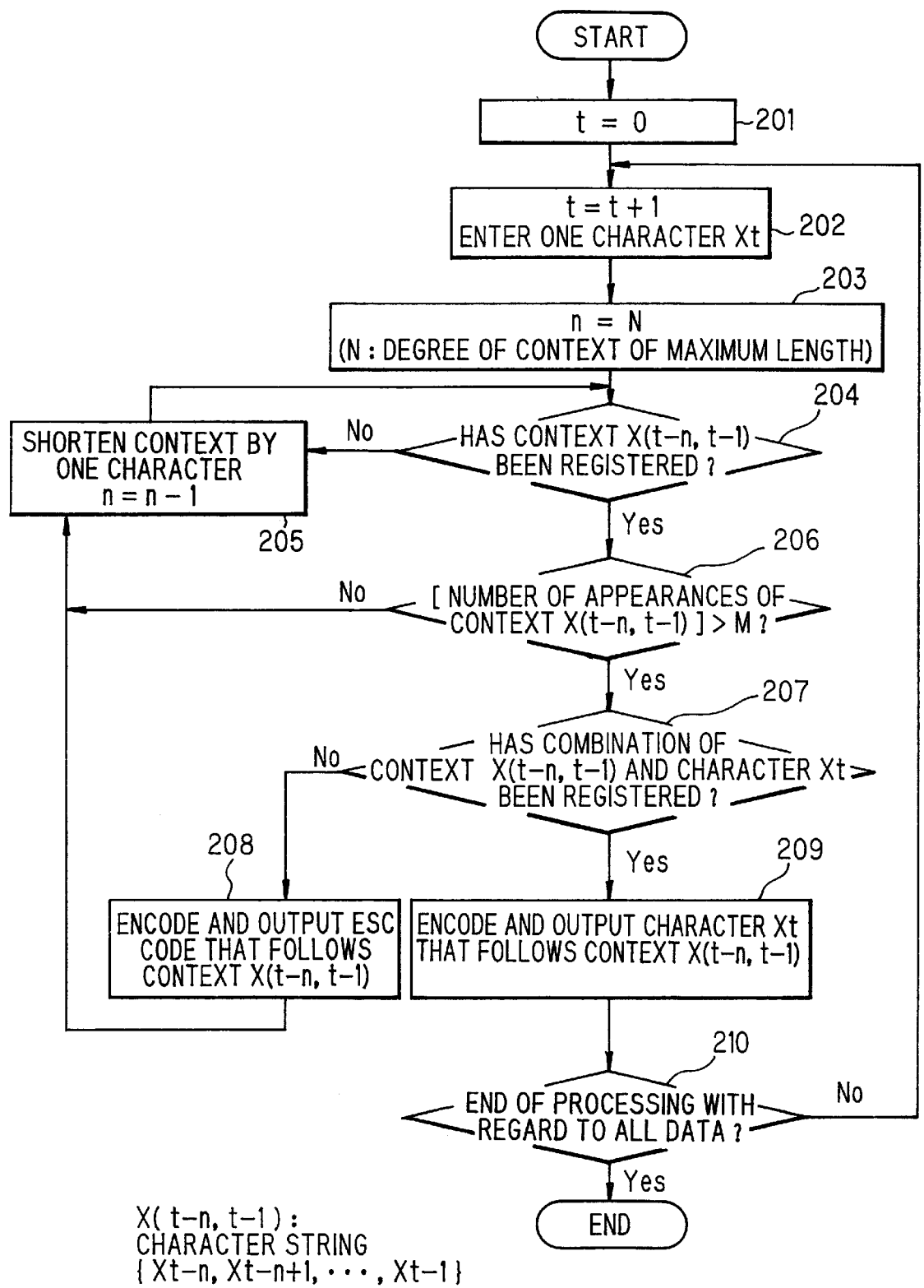
FIG. 2 is a first data compression processing flowchart for a case where encoding context is carefully selected.

(B) Embodiments of Data Compression/Restoration for Case where Encoding Context is Carefully Selected (a) First Embodiment FIG. 2 is a flowchart of data compression processing executed by the compressing encoder 13 in a case where encoding context is carefully selected.

The first step in the flowchart of FIG. 2 is to initialize a character number t to 0 (step 201). The character number t is then incremented and a character Xt, which is the t-th character, is entered (step 202). The degree n is then made the degree N of context of maximum length (step 203).

This is followed by step 204, at which it is determined whether the context X(t−n,t−1) has been registered in a context tree. It should be noted that the context X(t−n,t−1) is a character string {Xt−n, Xt−n+1, . . . , Xt−1}. If the context X(t−n,t−1) has not been registered ("No" at step 204), the degree n is decremented (step 205) and it is determined whether context shortened by one character has been registered (step 204).

If the context X(t−n,t−1) has been registered ("YES" at step 204), the number m of times the context (X(t−n,t−1) appears is decremented and it is determined whether m is greater than a set value M (step 206). If m is equal to or less than the set value M ("NO" at step 206), then processing from step 205 onward is executed without using the context X(t−n,t−1) as encoding context. Specifically, the degree n is decremented and it is determined whether context shortened by one character has been registered. If the number m of appearances of context X(t−n,t−1) is found to be greater than the set value M ("YES" at step 206), then it is determined whether a combination of the context X(t−n,t−1) and the source character Xt is present in the context tree (step 207).

If the combination is not present in the context tree, an escape code (ESC code) that follows the context X(t−n,t−1) is encoded and outputted (step 208), after which processing from step 205 onward is repeated.

If the combination of the context X(t−n,t−1) and the source character Xt is present in the context tree, then the source character Xt is encoded and outputted using the probability that the source character Xt will appear following the context X(t−n, t−1) (step 209). It is then determined whether the encoding of all data is finished (step 210). If encoding is not finished, the program returns to step 202 so that the above-described processing is repeated with regard to the next character to be encoded. It should be noted that the context registration unit 12 executes sequential registration of the context tree and updates the probability of appearance of the context in parallel with above-described compressive encoding processing.

Figure 3:
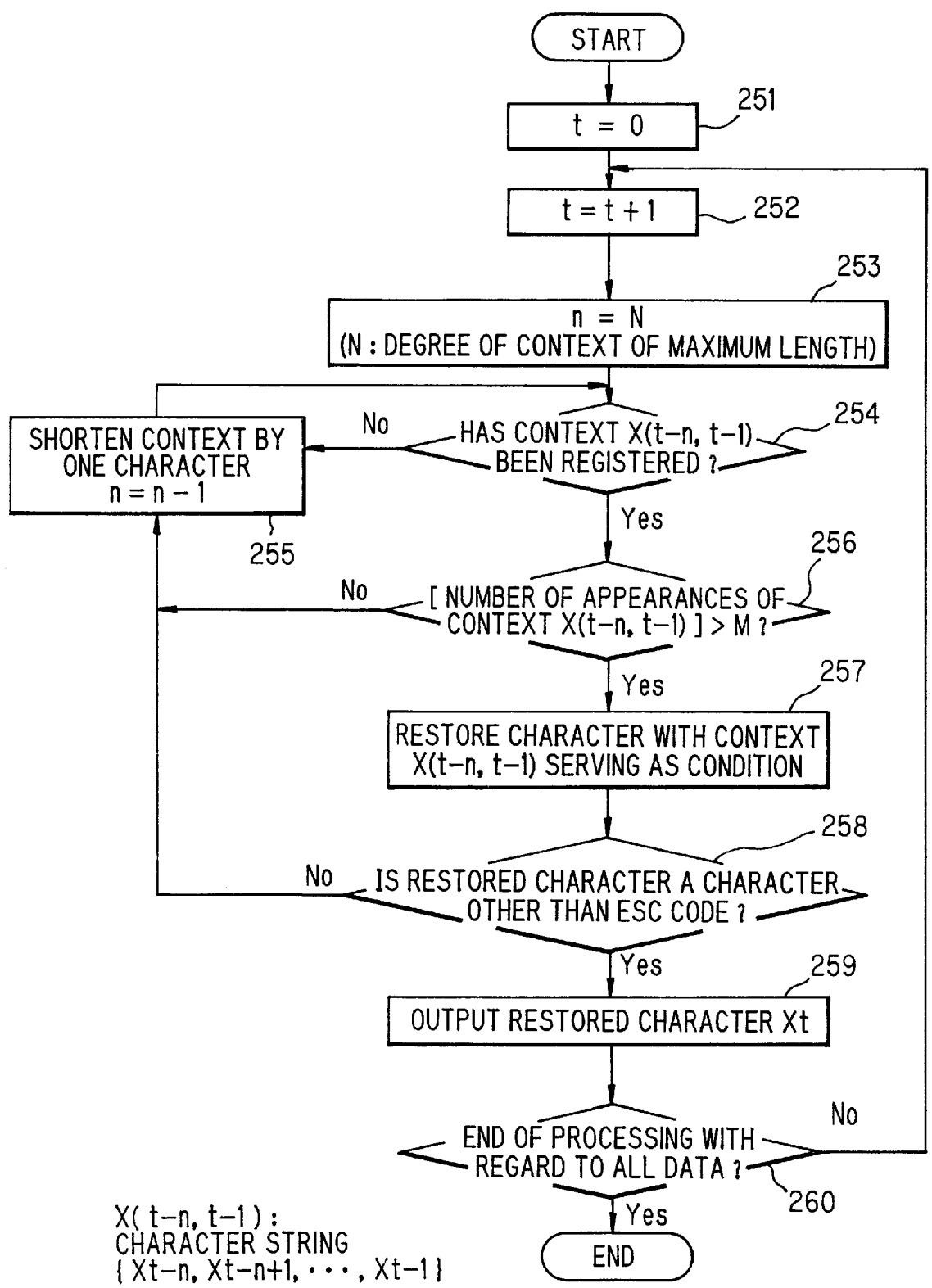
FIG. 3 is a first data restoration processing flowchart for a case where encoding context is carefully selected.

FIG. 3 is a flowchart of data restoration processing executed by the restoration unit 23 in a case where encoding context is carefully selected.

The first step in the flowchart of FIG. 3 is to initialize the code number t to 0 (step 251). The code number t is then incremented (step 252) and the degree n is then made the degree N of context of maximum length (step 253).

This is followed by step 254, at which it is determined whether the context X(t–n,t–1) has been registered in a context tree. It should be noted that the context X(t–n,t–1) is n-number of the latest character strings {Xt–n, Xt–n+1, . . . , Xt–1} already restored. If the context X(t–n,t–1) has not been registered, the degree n is decremented (step 255) and it is determined whether context shortened by a character has been registered (step 254). If the context X(t–n,t–1) has been registered ("YES" at step 254), the number m of times the context X(t–n,t–1) appears is incremented and it is determined whether m is greater than a set value M (step 256). If m is equal to or less than the set value M ("NO" at step 256), then processing from step 255 onward is executed because the context X(t–n,t–1) is not being used as encoding context. Specifically, the degree n is decremented and it is determined whether context shortened by one character has been registered. If the number m of appearances of context X(t–n,t–1) is found to be greater than the set value M ("YES" at step 256), then the t-th code is restored to a character code with the context X(t–n, t–1) serving as the condition (step 257).

Next, it is determined whether the restored character code is an ESC code (step 258). If the character code is the ESC code, then processing from step 255 onward is repeated. If the character code is not the ESC code, on the other hand, the restored character code is outputted (step 259). After the character code is outputted, it is determined whether reproduction processing is finished with regard to all data (step 260). If processing is not finished, the program returns to step 252 and the above-described processing is repeated for the next code. It should be noted that the context registration unit 22 executes sequential registration of the context tree and updates the probability of occurrence (the frequency of occurrence) of the context in parallel with above-described restoration processing.

Thus, only context having a high frequency of use can be employed as encoding context. As a result, it possible to avoid using meaninglessly long context, which has a low frequency of use, as encoding context, to simplify encoding (i.e., raise compression/restoration speed) and to improve compression ratio.

(b) Second Embodiment

Figure 4:
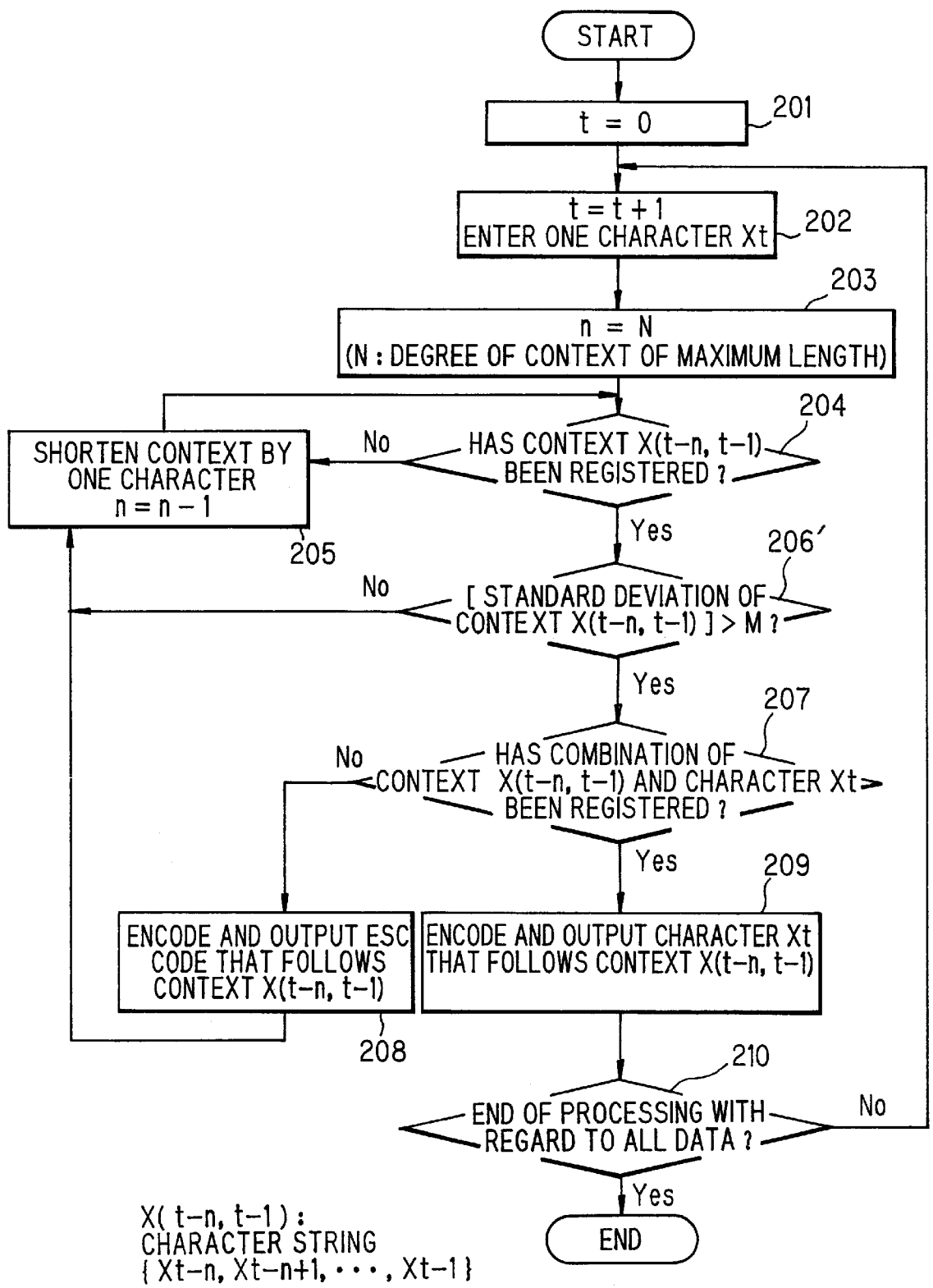
FIG. 4 is a second data compression processing flowchart for a case where encoding context is carefully selected.

FIG. 4 illustrates another flowchart of data compression processing executed by the compressing encoder 13 in a case where encoding context is carefully selected. Steps identical with those in the compression processing flowchart of FIG. 2 are designated by like step numbers. This flowchart differs from that of FIG. 2 in a step 206'. Specifically, if it is found at step 204 that the context X(t–n,t–1) has been registered, then the standard deviation m of the probability of occurrence of each character that appears following the context X(t–n,t–n) is obtained and it is determined whether the standard deviation m is greater than a fixed value M (step 206'). If the standard deviation m is equal to or less than the fixed value M, the processing of step 205 is executed. If the standard deviation m is greater than the fixed value M, it is determined whether the combination of the context X(t–n, t–1) and the source character Xt is present in the context tree (step 207).

The standard deviation is obtained in the manner set forth below. If we let the context X(t–n,t–1) be represented by "ab", let the characters that appear following this context be represented by a, b, c, d, e and f and let the frequencies of appearance of these characters be represented by na, nb, nc, nd, ne and nf, respectively, then the probabilities Pa–Pf that the characters a, b, c, d, e, and f will appear following the context "ab" will be as follows:

Pa=na/M (where M=na+nb+nc+nd+ne+nf)

Pb=nb/M

Pc=nc/M

Pd=nd/M

Pe=ne/M

Pf=nf/M and the average probability H of appearance of each character will be ⅙.

Accordingly, the standard deviation m can be calculated in accordance with the following equation:

$$m = \sqrt{\{Pa - H\}^2 + \{Pb - H\}^2 + \{Pc - H\}^2 + \{Pd - H\}^2 + \{Pe - H\}^2 + \{Pf - H\}^2}$$

A large standard deviation means that the frequency of appearance of a character that appears following the context X(t–n,t–1) is considerably large in comparison with the average frequency of appearance. Accordingly, step 206' of the compression processing flowchart of FIG. 4 can be changed in such a manner that it is determined whether the frequency r of appearance of a character that often appears among characters that appear following the context X(t–n, t–1) is greater than a fixed value R, step 207 is executed when r>R holds and step 205 is execute when r≦R holds.

Figure 5:
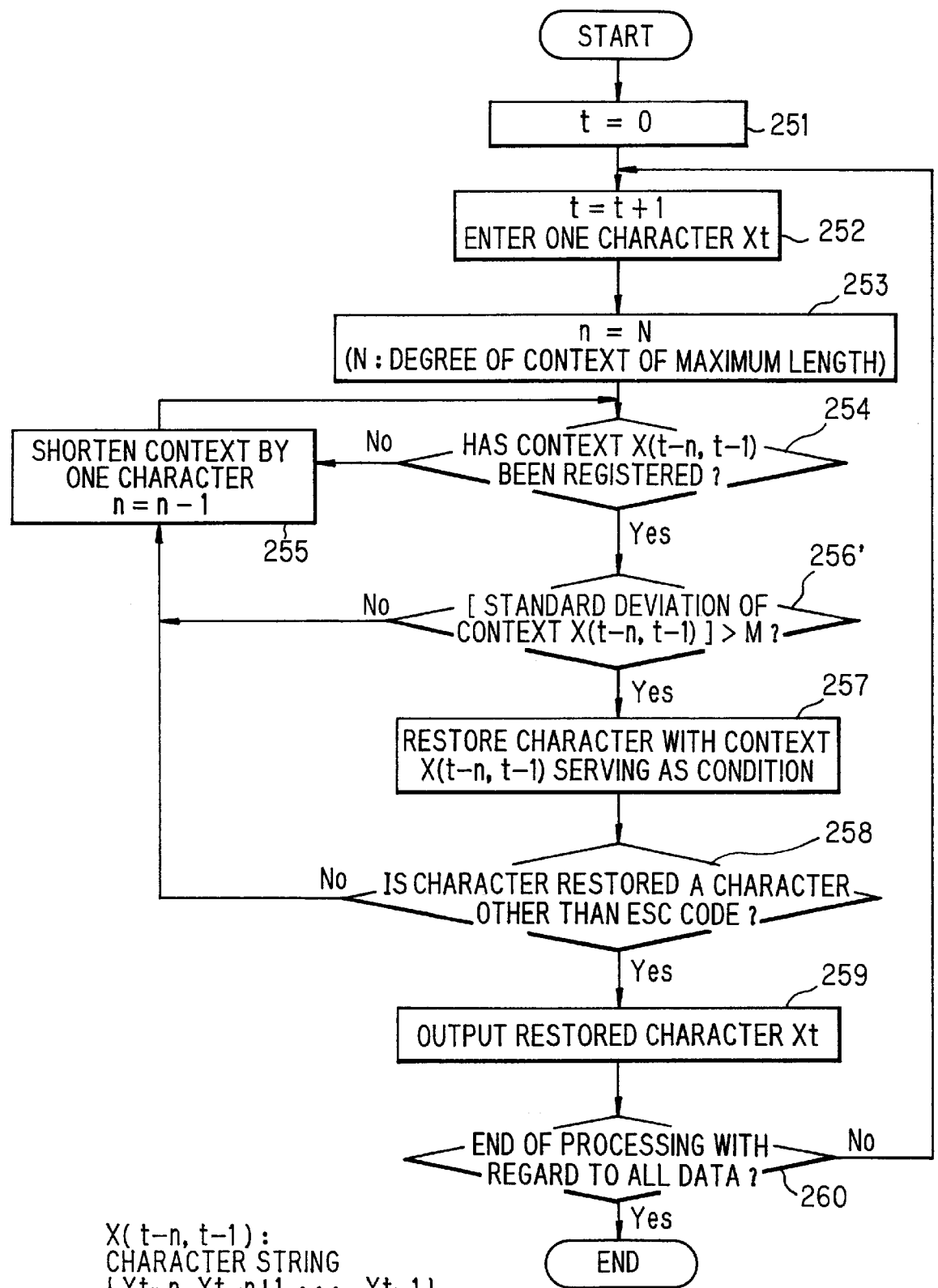
FIG. 5 is a second data restoration processing flowchart for a case where encoding context is carefully selected.

FIG. 5 illustrates a flowchart of data restoration processing executed by the restoration unit 23 in a case where encoding context is carefully selected. Steps identical with those in the restoration processing flowchart of FIG. 3 are designated by like step numbers. This flowchart differs from that of FIG. 3 in a step 256'. Specifically, if it is found at step 254 that the context X(t–n,t–1) has been registered, then the standard deviation m of the probability of occurrence of each character that appears following the context X(t–n,t–n) is obtained and it is determined whether the standard deviation m is greater than a fixed value M (step 256'). If the standard deviation m is equal to or less than the fixed value M, the processing of step 255 is executed. If the standard deviation m is greater than the fixed value M, it is determined whether the combination of the context X(t–n,t–1) and the source character Xt is present in the context tree (step 257).

Thus, only context having a high frequency of use can be employed as encoding context. As a result, it possible to avoid using meaninglessly long context, which has a low frequency of use, as encoding context, to simplify encoding (i.e., raise compression/restoration speed) and to improve compression ratio.

Figure 6:
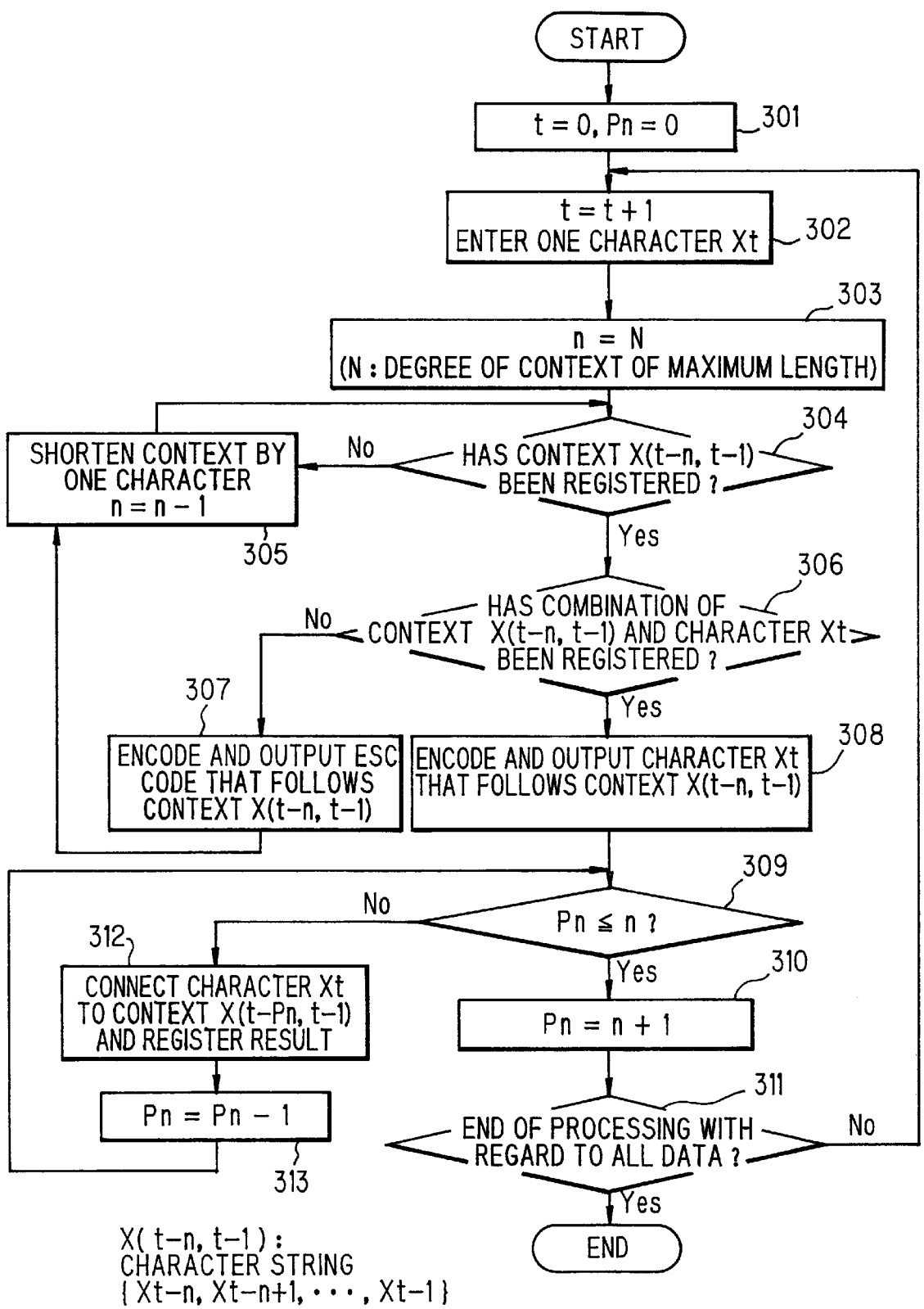
FIG. 6 is a first data compression processing flowchart for a case where registered context is carefully selected.

(C) Embodiments of Data Compression/Restoration for Case where Registered Context is Carefully Selected (a) First Embodiment FIG. 6 is a flowchart of data compression processing executed by the compressing encoder 13 in a case where registered context is carefully selected.

The first step in the flowchart of FIG. 6 is to initialize a character number t as well as Pn to 0 (step 301), where Pn is obtained by adding 1 to the degree of context (encoding context) that was used in the encoding of the immediately preceding character. Since encoding will have not yet been carried out at the start of processing, Pn is set to 0 at step 301.

Next, the character number t is incremented, a character Xt, which is the t-th character, is entered (step 302), and the degree n is then made the degree N of context of maximum length (step 303).

This is followed by step 304, at which it is determined whether the context X(t−n,t−1) has been registered in a context tree. It should be noted that the context X(t−n,t−1) is a character string {Xt−n, Xt−n+1, . . . , Xt−1}. If the context X(t−n,t−1) has not been registered ("NO" at step 304), the degree n is decremented (step 305) and it is determined whether context shortened by one character has been registered (step 304).

If the context X(t−n,t−1) has been registered ("YES" at step 304), it is determined whether the combination of the context X(t−n,t−1) and source character Xt to be encoded is present in a context tree (step 306). If the combination is not present in the context tree ("NO" at step 306), an escape code (ESC code) that follows the context X(t−n,t−1) is encoded and outputted (step 307), after which processing from step 305 onward is repeated.

If the combination of the context X(t−n,t−1) and the source character Xt is present in the context tree ("YES" at step 306), then the source character Xt is encoded and outputted using the probability that the source character Xt will appear following the context Xt−n, t−1) (step 308).

Next, it is determined whether the relation Pn<n holds (step 309). More specifically, the value Pn, which is obtained by adding 1 to the degree of encoding context of the immediately preceding character, and the degree n of the currently prevailing encoding context are compared. If Pn≦n holds, the operation n+1→Pn is performed (step 310), after which it is determined whether the encoding of all data has been completed (step 311). If encoding is not finished, the program returns to step 302 so that the above-described processing is repeated with regard to the next source character.

If it is found at step 309 that the relation Pn>n holds, i.e., if the value Pn, which is obtained by adding 1 to the degree of encoding context of the immediately preceding character, is greater than the degree n of the currently prevailing encoding context, then the context obtained by connecting the source character Xt to the context X(t−Pn,t−1) is registered (step 312). In other words, the context obtained by connecting the source character Xt to the encoding context X(t−Pn,t−1) of the immediately preceding character is registered.

Next, Pn is decremented (step 313), after which the processing of steps 309, 312 and 313 is repeated until the relation Pn≦n is established. It should be noted that registration of new context is not carried out at step 312 from the second cycle of processing onward because encoding context of maximum length will already have been registered the first time step 312 was executed.

Thus, compressive encoding and registration of context that prevails when Pn≦n holds are carried out. If Pn≦n holds at step 309, sequential registration is carried out in parallel fashion.

In accordance with this compressing encoding method, a character string (context) obtained by adding a source character to encoding context used by the immediately preceding character is adopted as registered context. As a result, only strongly correlated, effective context can be carefully selected and registered and registration of meaninglessly long context can be avoided. Moreover, encoding is simplified, more effective utilization of memory is made and the compression ratio is improved.

Figure 7:
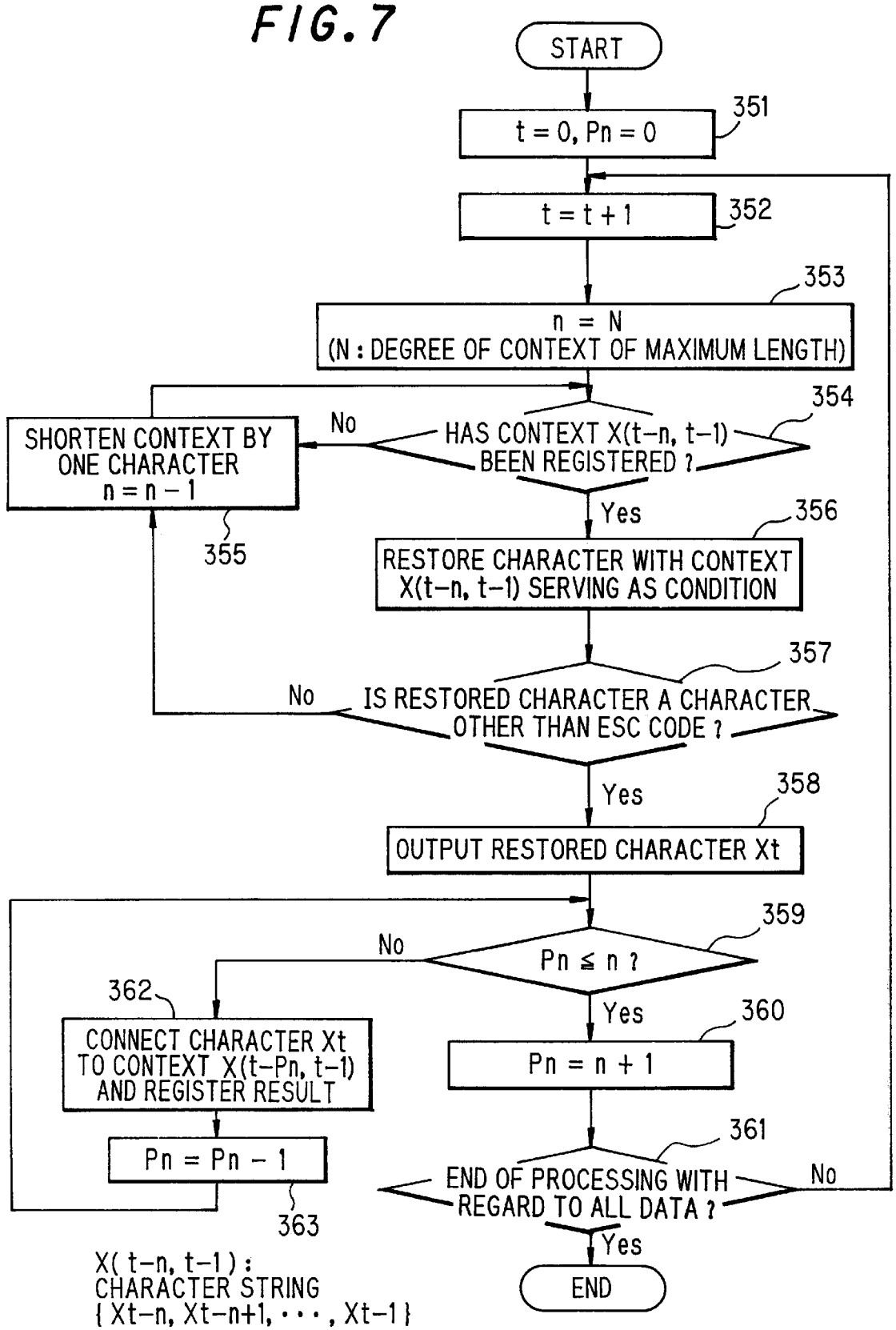
FIG. 7 is a first data restoration processing flowchart for a case where registered context is carefully selected.

FIG. 7 is a flowchart of data restoration processing executed by the restoration unit 23 in a case where registered context is carefully selected.

The first step in the flowchart of FIG. 7 is to initialize the code number t as well as Pn to 0 (step 351), where Pn is obtained by adding 1 to the degree of context that was used in the restoration of the immediately preceding character. Since restoration will have not yet been carried out at the start of processing, Pn is set to 0 at step 351.

Next, the code number t is incremented (step 352) and the degree n is made the degree N of context of maximum length (step 353).

This is followed by step 354, at which it is determined whether the context X(t−n,t−1) has been registered in a context tree. It should be noted that the context X(t−n,t−1) is n-number of the latest character strings {Xt−n, Xt−n+1, . . . , Xt−1} already restored.

If the context X(t−n,t−1) has not been registered, the degree n is decremented (step 355) and it is determined whether context shortened by one character has been registered (step 354). If the context X(t−n,t−1) has been registered ("YES" at step 354), the t-th code is restored to a character code with the context X(t−n,t−1) serving as the condition (step 356).

Next, it is determined whether the restored character code is an ESC code (step 357). If the character code is the ESC code, then processing from step 355 onward is repeated. If the character code is not the ESC code, on the other hand, the restored character code is outputted (step 358) and it is determined whether the relation Pn≦n holds (step 359).

If Pn≦n holds, the operation n+1→Pn is performed (step 360), after which it is determined whether the restoration of all data has been completed (step 361). If restoration is not finished, the program returns to step 352 so that the above-described processing is repeated with regard to the next code.

If it is found at step 359 that the relation Pn>n holds, i.e., if the value Pn, which is obtained by adding 1 to the degree of encoding context of the character restored immediately previously, is greater than the degree n of the encoding context of the currently restored character, then the context obtained by connecting the restored character Xt to the context X(t−Pn,t−1) is registered (step 362). In other words, the context obtained by connecting the currently restored character Xt to the encoding context X(t−Pn,t−1) of the immediately preceding restored character is registered.

Next, Pn is decremented (step 363), after which the processing of steps 359, 362 and 363 is repeated until the relation Pn≦n is established. It should be noted that registration of new context is not carried out at step 362 from the second cycle of processing onward because encoding context of maximum length will already have been registered the first time step 362 was executed.

Thus, restoration processing and registration of context that prevails when Pn>n holds are carried out. If Pn≦n holds at step 359, sequential registration is carried out in parallel fashion.

(b) Second Embodiment

Figure 8:
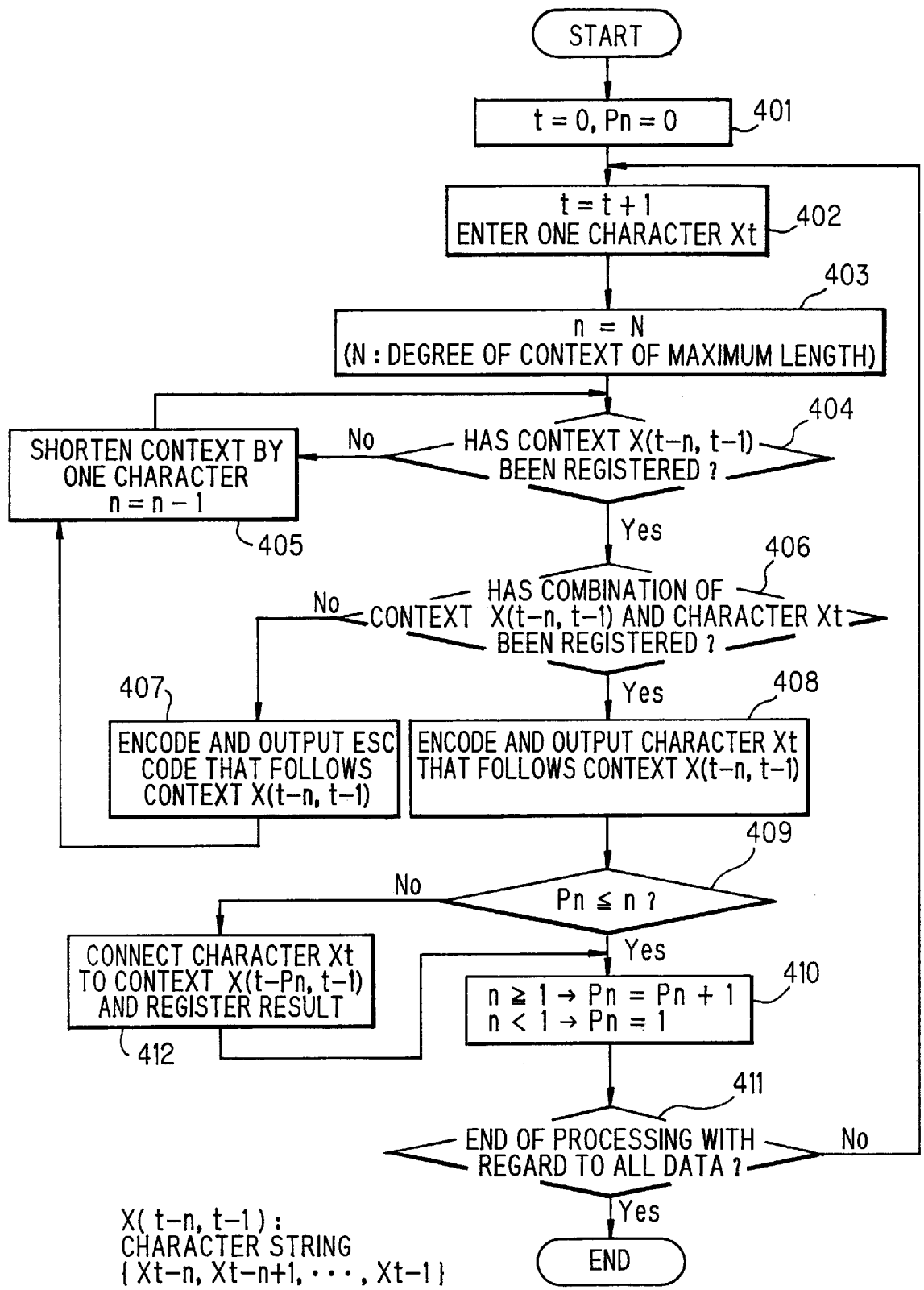
FIG. 8 is a first data compression processing flowchart for a case where registered context is carefully selected.

FIG. 8 illustrates another flowchart of data compression processing executed by the compressing encoder 13 in a case where registered context is carefully selected. This embodiment is so adapted that if degrees of encoding contexts of characters preceding a source character are successively equal to or greater than degree 1, context comprising each of these contexts and the source character is adopted as the object of registered context.

The first step in the flowchart of FIG. 8 is to initialize a character number t as well as Pn to 0 (step 401). In a case where the degrees of encoding contexts are successively equal to or greater than degree 1, Pn is obtained by adding 1 to the number of times the degrees of encoding contexts are successively equal to or greater than degree 1. Since encoding will have not yet been carried out at the start of processing, Pn is set to 0 at step 401.

Next, the character number t is incremented, a character Xt, which is the t-th character, is entered (step 402), and the degree n is then made the degree N of context of maximum length (step 403).

This is followed by step 404, at which it is determined whether the context X(t−n,t−1) has been registered in a context tree. It should be noted that the context X(t−n,t−1) is a character string {Xt−n, Xt−n+1, . . . , Xt−1}. If the context X(t−n,t−1) has not been registered ("NO" at step 404), the degree n is decremented (step 405) and it is determined whether context shortened by one character has been registered (step 404).

If the context X(t−n,t−1) has been registered ("YES" at step 404), it is determined whether the combination of the context X(t−n,t−1) and source character Xt is present in a context tree (step 406). If the combination is not present in the context tree ("NO" at step 406), an escape code (ESC code) that follows the context X(t−n,t−1) is encoded and outputted (step 407), after which processing from step 405 onward is repeated.

If the combination of the context X(t−n,t−1) and the source character Xt is present in the context tree ("YES" at step 406), then the source character Xt is encoded and outputted using the probability that the source character Xt will appear following the context Xt−n, t−1) (step 308).

Next, it is determined whether the relation Pn≦n holds (step 409). More specifically, the value Pn, which is obtained by adding 1 to the number of times the degrees of encoding contexts are successively equal to or greater than degree 1 (if such is the case), and the degree n of the currently prevailing encoding context are compared. If Pn≦n holds, it is determined whether n≧1 holds. If n≧1 holds, i.e., if the degree of encoding context is equal to or greater than degree 1, then Pn is incremented. If n<0 (n=0) holds, then the operation Pn=1 is performed (step 410), after which it is determined whether the encoding of all data has been completed (step 411). If encoding is not finished, the program returns to step 402 so that the above-described processing is repeated with regard to the next source character.

If it is found at step 409 that the relation Pn>n holds, i.e., if the value Pn, which is obtained by adding 1 to the number of times the degrees of encoding context are successively greater than degree 1 (if such is the case), is greater than the degree n of the currently prevailing encoding context, then the context obtained by connecting the source character Xt to the context X(t−Pn,t−1) is registered (step 412). In other words, the character string (context) obtained by connecting the source character Xt to Pn-number of successive character strings immediately preceding the source character Xt is registered (step 412). Processing from step 410 onward is then repeated.

Thus, compressive encoding and registration of context that prevails when Pn>n holds are carried out. If Pn≦n holds at step 409, sequential registration is carried out in parallel fashion.

In accordance with this compressing encoding method, if degrees of encoding contexts of characters preceding a source character are successively equal to or greater than degree 1, context comprising each of these contexts and the source character is adopted as the object of registered context. As a result, only strongly correlated, effective context can be carefully selected and registered. In addition, since encoding contexts successively equal to or greater than degree 1 are connected and registered, long context that is necessary can be registered immediately.

Figure 9:
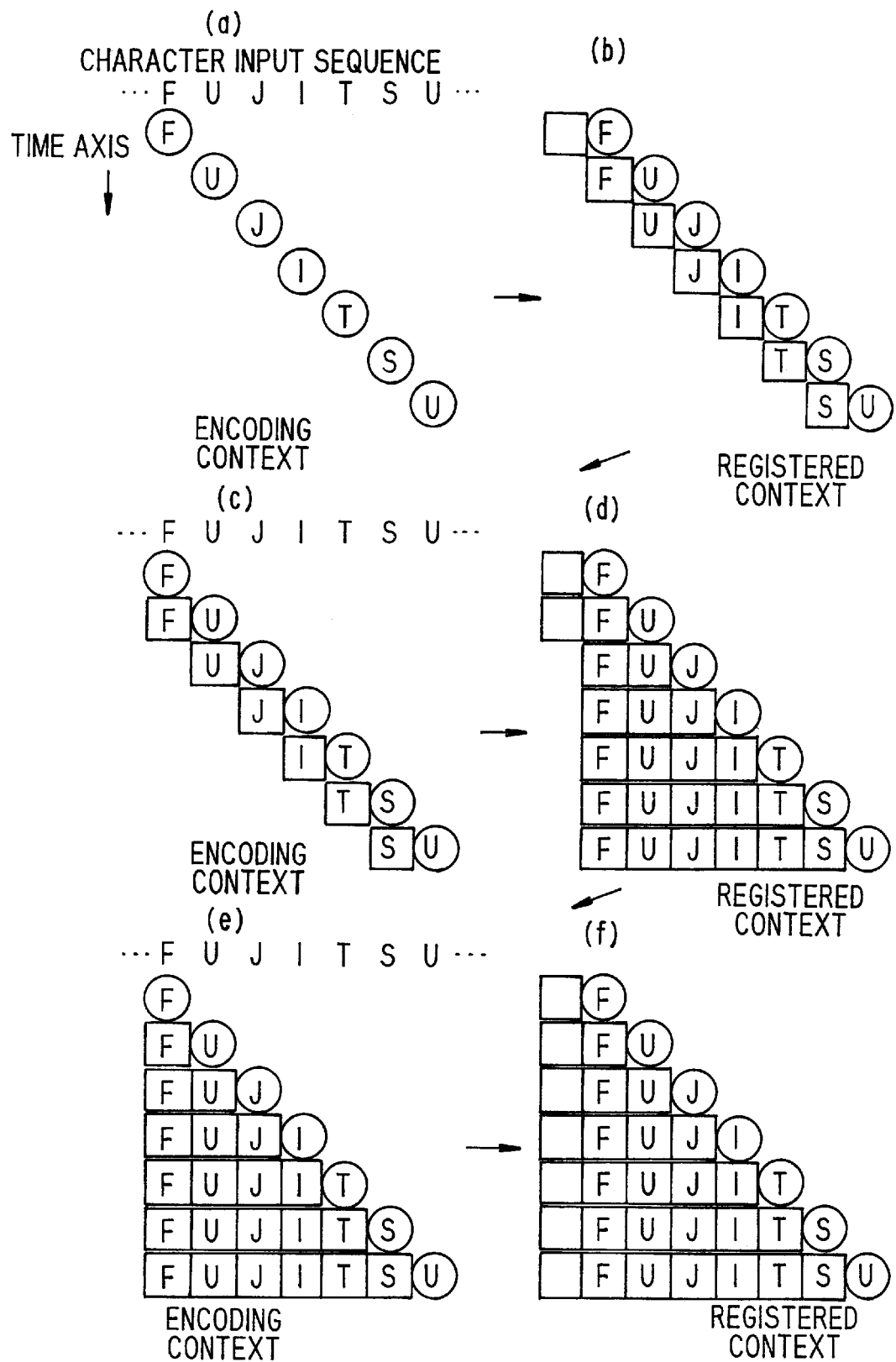
FIG. 9 is a diagram for describing registered context for a case where registered context is carefully selected.

FIG. 9 is a diagram for describing the compressing coding method set forth above. More specifically, FIG. 9 is a diagram for describing registered context in a case where the character string "FUJITSU" has appeared three consecutive times. Each of the characters F, U, J, I, T, S, U has been initially registered as encoding context (context of degree 0) [see (a) in FIG. 9]. If the initial character string "FUJITSU" is entered under these conditions, the following contexts are registered by sequential registration, as indicated at (b) in FIG. 9:

F

FU

UJ

JI

IT

TS

SU

If the next character string "FUJITSU" is entered under these conditions, encoding is performed with the registered contexts of (b) serving as the encoding context. In addition, the following contexts are registered in the manner indicated at (d):

F,

FU,

FUJ,

FUJI,

FUJIT,

FUJITS,

FUJITSU

Figure 27:
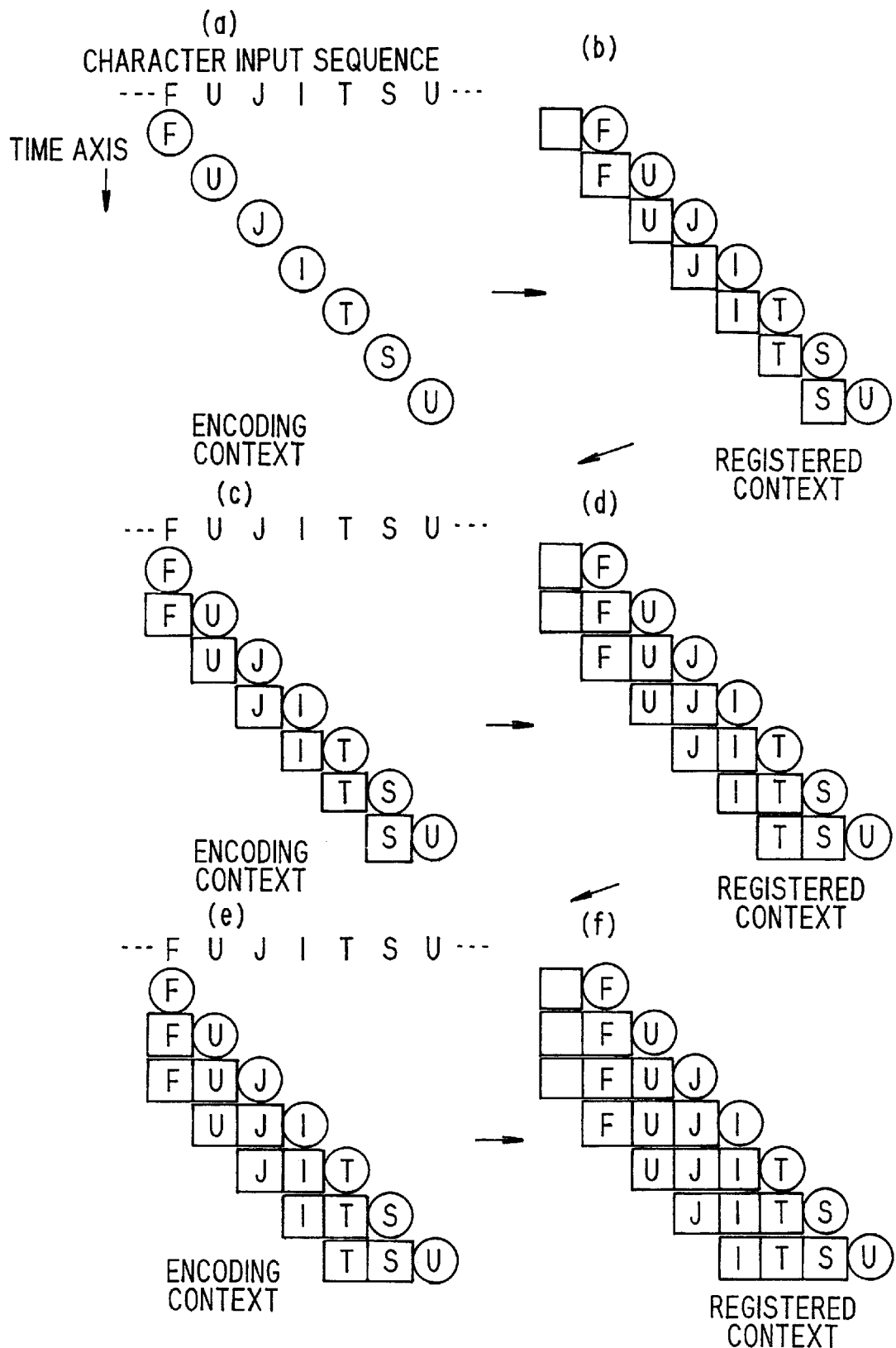
FIG. 27 is a diagram for describing a sequential registration method.
Figure 28:
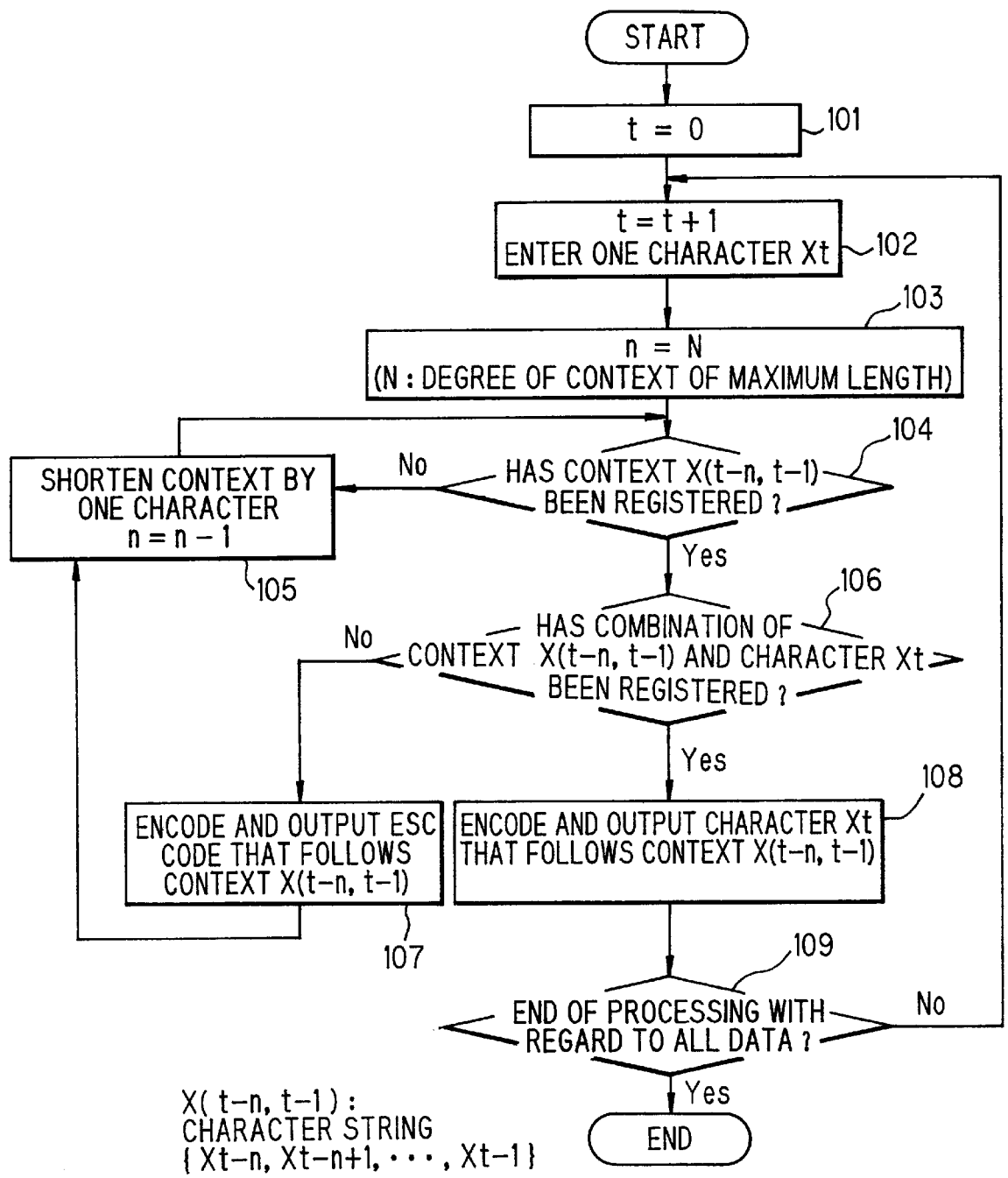
FIG. 28 illustrates a conventional blended model (compression method)

As a result, encoding can be performed using these registered contexts from the third time onward. This makes it possible to improve the compression ratio. With the sequential registration method described in connection with FIG. 27, the context "FUJITSU" is first registered after the character string "FUJITSU" appears six times. Consequently, the context cannot readily be extended and the compression ratio is poor.

Figure 10:
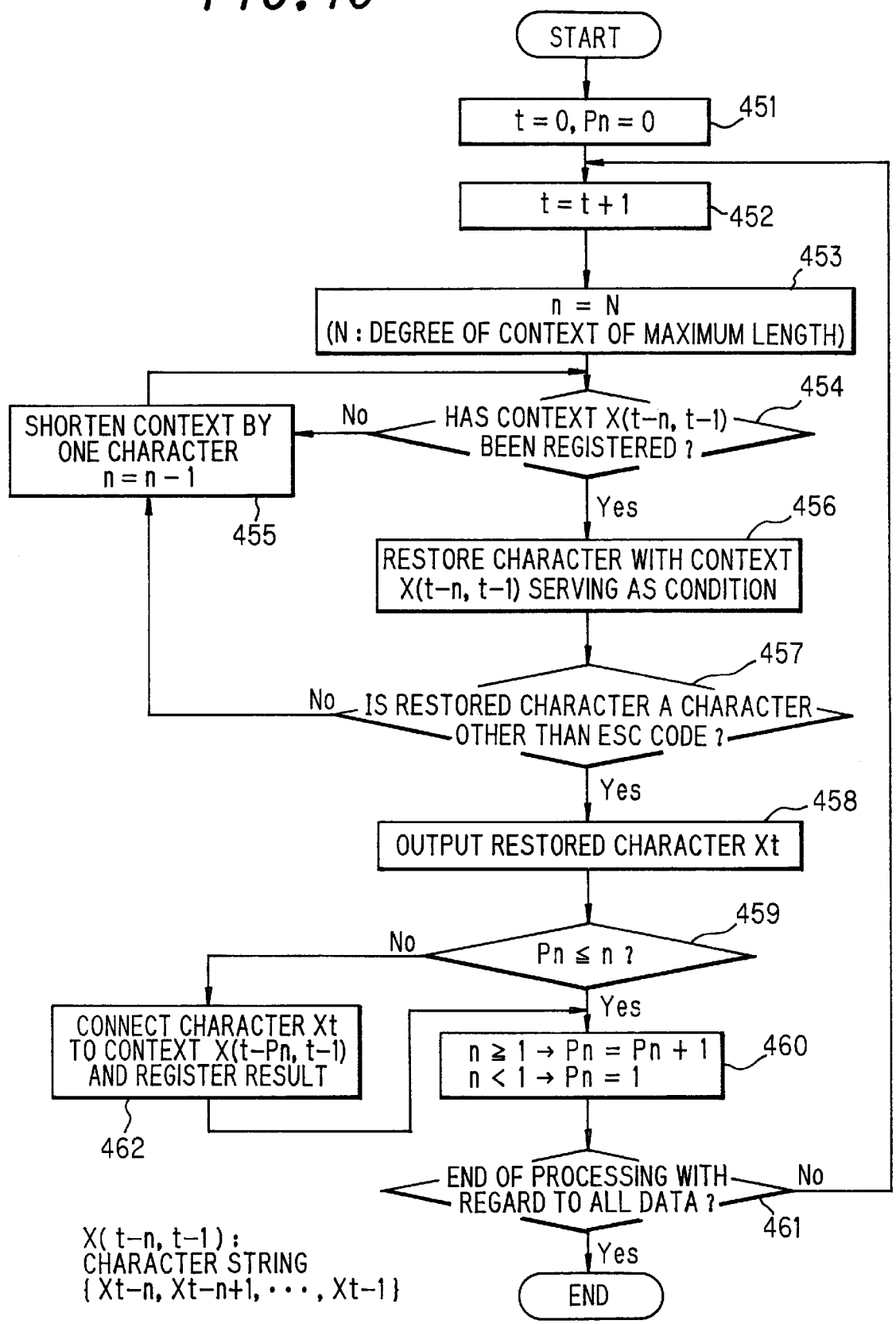
FIG. 10 is a second data restoration processing flowchart for a case where registered context is carefully selected.

FIG. 10 is a flowchart of data restoration processing executed by the restoration unit 23 in a case where registered context is carefully selected.

The first step in the flowchart of FIG. 10 is to initialize the code number t as well as Pn to 0 (step 451), where Pn is obtained by adding 1 to the degree of context that was used in the restoration of the immediately preceding character. Since restoration will have not yet been carried out at the start of processing, Pn is set to 0 at step 451.

Next, the code number t is incremented (step 452) and the degree n is made the degree N of context of maximum length (step 453).

This is followed by step 454, at which it is determined whether the context X(t−n,t−1) has been registered in a context tree. It should be noted that the context X(t−n,t−1) is n-number of the latest character strings {Xt−n, Xt−n+1, . . . , Xt−1} already restored.

If the context X(t−n,t−1) has not been registered, the degree n is decremented (step 455) and it is determined whether context shortened by one character has been registered (step 454). If the context X(t−n,t−1) has been registered ("YES" at step 454), the t-th code is restored to a character code with the context X(t−n,t−1) serving as the condition (step 456).

Next, it is determined whether the restored character code is an ESC code (step 457). If the character code is the ESC code, then processing from step 455 onward is repeated.

If the character code is not the ESC code, on the other hand, the restored character code is outputted (step 458) and it is determined whether the relation Pn≦n holds (step 459). In other words, the value Pn, which is obtained by adding 1 to the number of times the degrees of encoding context are successively equal to or greater than degree 1 (if such is the case), and the degree n of the encoding context that was used in the current restoration are compared.

If Pn≦n holds, it is determined whether n≦1 holds. If n≧1 holds, i.e., if the degree of encoding context is equal to or greater than degree 1, then Pn is incremented. If n<0 (n=0) holds, then the operation Pn=1 is performed (step 460), after which it is determined whether the restoration of all data has been completed (step 461). If restoration is not finished, the program returns to step 452 so that the above-described processing is repeated with regard to the next code.

If it is found at step 459 that the relation Pn>n holds, i.e., if the value Pn, which is obtained by adding 1 to the number of times the degrees of encoding context are successively equal to or greater than degree 1 (if such is the case) is greater than the degree n of the encoding context that was used in the current restoration, then the context obtained by connecting the restored character Xt to the context X(t−Pn, t−1) is registered (step 462). More specifically, the character string (context) obtained by connecting this restored character Xt to Pn-number of restored character strings immediately preceding the currently restored character Xt is registered. Processing from step 410 onward is then repeated.

Thus, restoration processing and registration of context that prevails when Pn>n holds are carried out. If Pn≦n holds at step 409, sequential registration is carried out in parallel fashion.

(c) Third Embodiment

Figure 11:
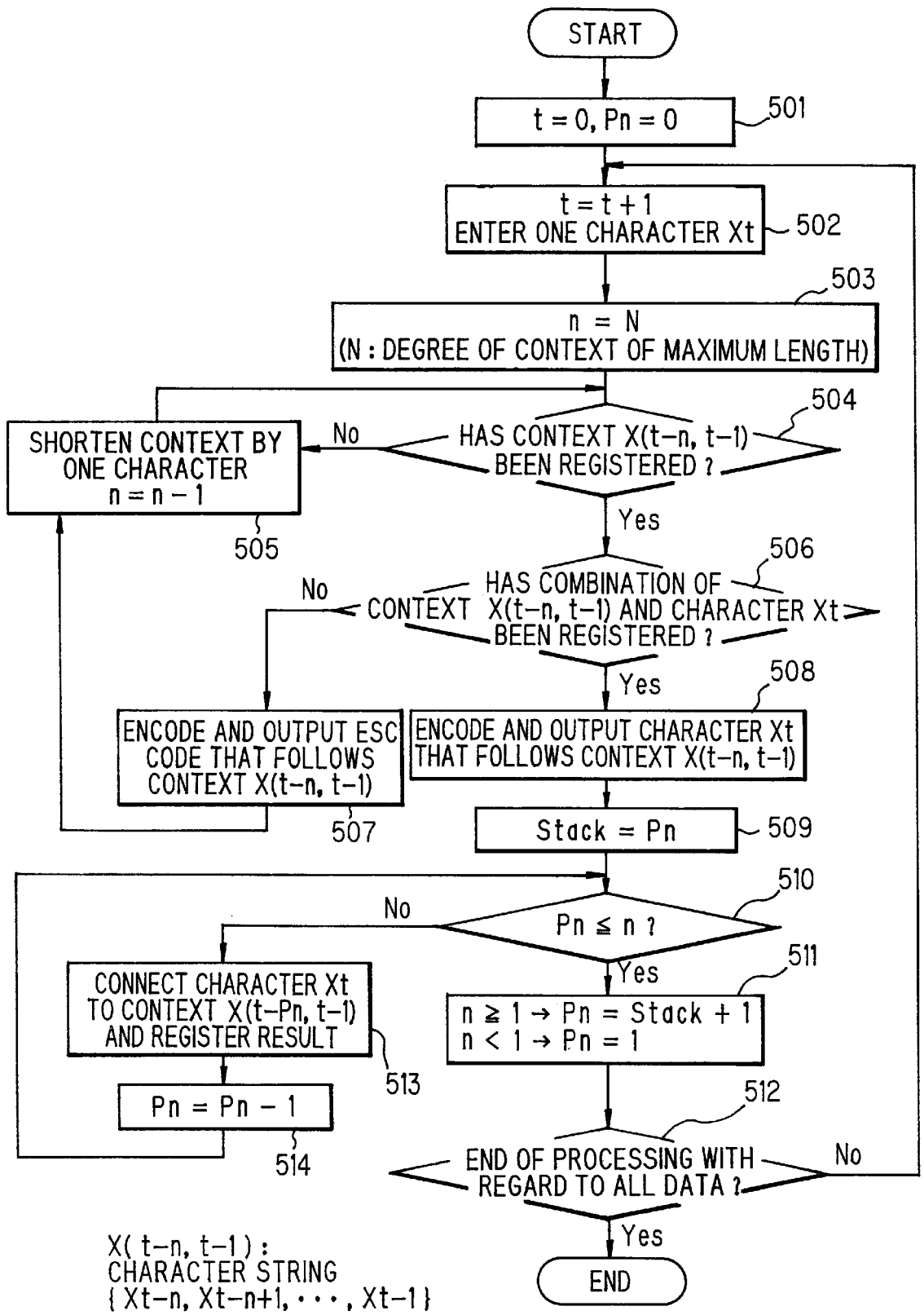
FIG. 11 is a third data compression processing flowchart for a case where registered context is carefully selected.

FIG. 11 illustrates another flowchart of data compression processing executed by the compressing encoder 13 in a case where registered context is carefully selected. In this embodiment, encoding contexts of characters preceding a source character and encoding context of the source character are connected and context longer than the degree of the encoding context of the immediately preceding character is adopted as the object of registered context. More specifically, in a case where encoding has been performed using encoding context of degree 1 or greater with regard to each of m-number of successive characters, context obtained by appending the source character to m-number of character strings is registered.

The first step in the flowchart of FIG. 11 is to initialize a character number t as well as Pn to 0 (step 501). In a case where an input character has been successively encoded using encoding contexts of degree 1 or greater, Pn is a value obtained by adding 1 to the number of times coding has been successively performed. Since encoding will have not yet been carried out at the start of processing, Pn is set to 0 at step 501.

Next, the character number t is incremented, a character Xt, which is the t-th character, is entered (step 502), and the degree n is then made the degree N of context of maximum length (step 503).

This is followed by step 504, at which it is determined whether the context X(t−n,t−1) has been registered in a context tree. It should be noted that the context X(t−n,t−1) is a character string {Xt−n, Xt−n+1, . . . , Xt−1}. If the context X(t−n,t−1) has not been registered ("NO" at step 504), the degree n is decremented (step 505) and it is determined whether context shortened by one character has been registered (step 504).

If the context X(t−n,t−1) has been registered ("YES" at step 504), it is determined whether the combination of the context X(t−n,t−1) and source character Xt is present in a context tree (step 506). If the combination is not present in the context tree ("NO" at step 506), an escape code (ESC code) that follows the context X(t−n,t−1) is encoded and outputted (step 507), after which processing from step 505 onward is repeated.

If the combination of the context X(t−n,t−1) and the source character Xt is present in the context tree ("YES" at step 506), then the source character Xt is encoded and outputted using the probability that the source character Xt will appear following the context Xt−n, t−1) (step 508).

Next, Pn is saved as Stack =Pn (step 509) and it is determined whether Pn≦n holds (step 510). More specifically, the value Pn, which is obtained by adding 1 to the number of times the input character was successively encoded (if such was the case) using contexts of degree 1 or greater, and the degree n of the currently prevailing encoding context are compared. If Pn≦n holds, it is determined whether n≧1 holds. If n≧1 holds, i.e., if the source character has been encoded using encoding contexts of degree 1 or greater, then Pn is incremented (Stack+1→Pn). If n<0 (n=0) holds, then the operation Pn=1 is performed (step 511), after which it is determined whether the encoding of all data has been completed (step 512). If encoding is not finished, the program returns to step 502 so that the above-described processing is repeated with regard to the next source character.

If it is found at step 510 that the relation Pn>n holds, i.e., if the value Pn, which is obtained by adding 1 to the number of times the input character was successively encoded (if such was the case) using contexts of degree 1 or greater, is greater than the degree n of the currently prevailing encoding context, then the context obtained by connecting the source character Xt to the context X(t−Pn,t−1) is registered (step 513). In other words, the character string (context) obtained by connecting the source character Xt to Pn-number of successive character strings immediately preceding the source character Xt is registered (step 514). The processing of steps 510, 513 and 514 is then repeated until the relation Pn≦n is established. It should be noted that registration of new context is not carried out at step 513 from the second cycle of processing onward because encoding context of maximum length will already have been registered the first time step 513 was executed.

Thus, compressive encoding and registration of context that prevails when Pn>n holds are carried out. If Pn≦n holds at step 510, sequential registration is carried out in parallel fashion.

In accordance with this compressing encoding method, if encoding has been performing using encoding context of degree 1 or greater with regard to each of m-number of successive characters, context obtained by appending the source code to m-number of character strings is registered. As a result, only strongly correlated, effective context can be carefully selected and registered. In addition, long context that is necessary can be registered immediately.

It should be noted that the diagram of FIG. 9 for describing compressing encoding processing is applicable also to a description of the compressing encoding method of FIG. 10. More specifically, in accordance with this compressing encoding method, the following contexts are registered in the manner illustrated at (d) in FIG. 9 by entering "FUJITSU" two times:

F,
FU,
FUJ,
FUJI,
FUJIT,
FUJITS,
FUJITSU

Figure 12:
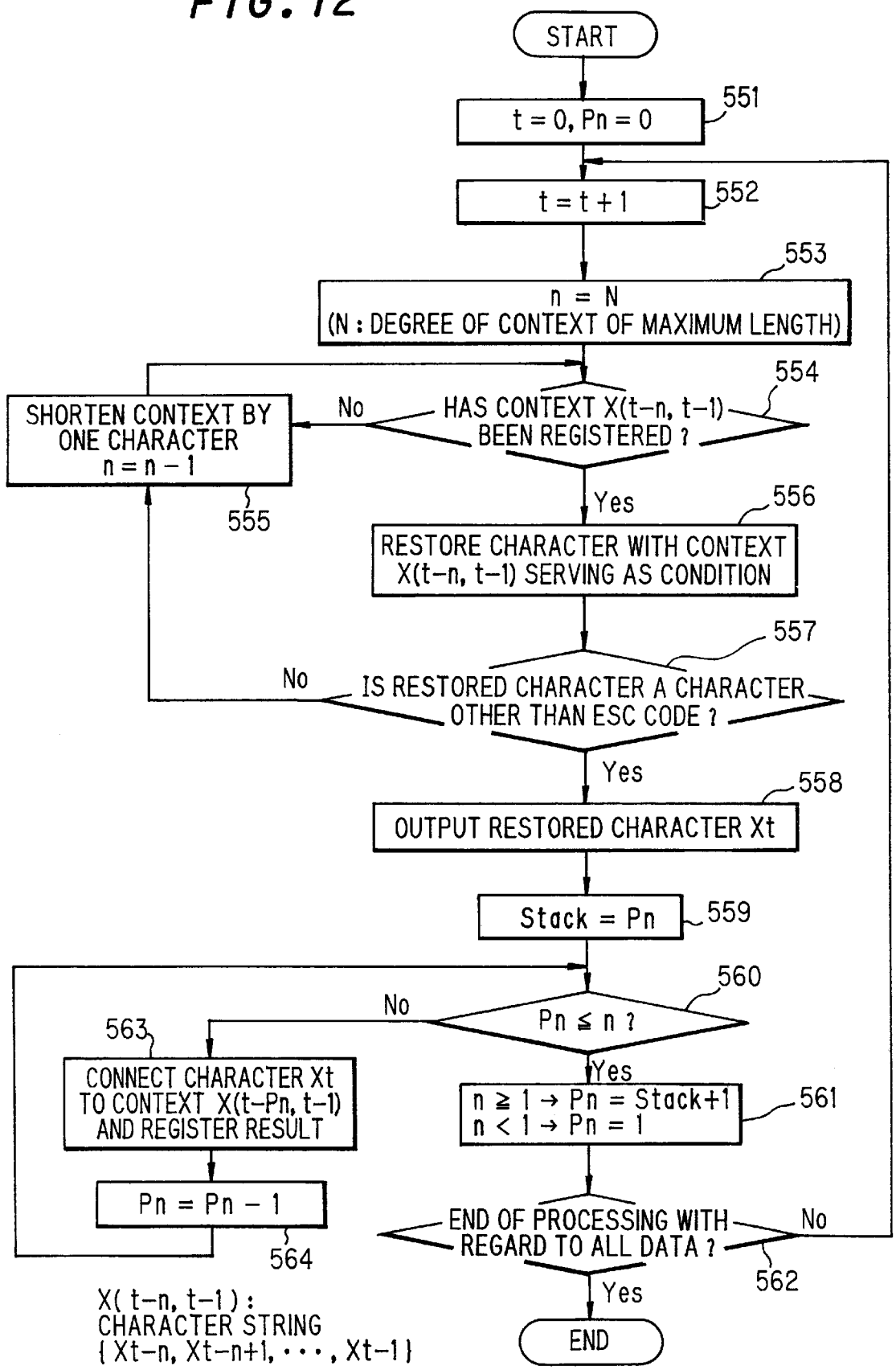
FIG. 12 is a third data restoration processing flowchart for a case where registered context is carefully selected.

FIG. 12 is a flowchart of data restoration processing executed by the restoration unit 23 in a case where registered context is carefully selected.

The first step in the flowchart of FIG. 12 is to initialize the code number t as well as Pn to 0 (step 551), where Pn is obtained by adding 1 to the number of characters successively restored using encoding contexts of degree 1 or greater. Since restoration will have not yet been carried out at the start of processing, Pn is set to 0 at step 451.

Next, the code number t is incremented (step 552) and the degree n is made the degree N of context of maximum length (step 553).

This is followed by step 554, at which it is determined whether the context X(t−n,t−1) has been registered in a context tree. It should be noted that the context X(t−n,t−1) is n-number of the latest character strings {Xt−n, Xt−n+1, ... , Xt−1} already restored.

If the context X(t−n,t−1) has not been registered, the degree n is decremented (step 555) and it is determined whether context shortened by one character has been registered (step 554). If the context X(t−n,t−1) has been registered ("YES" at step 454), the t-th code is restored to a character code with the context X(t−n,t−1) serving as the condition (step 556).

Next, it is determined whether the restored character code is an ESC code (step 557). If the character code is the ESC code, then processing from step 555 onward is repeated.

If the character code is not the ESC code, on the other hand, the restored character code is outputted (step 558), Pn is saved as Stack=Pn (step 559) and it is determined whether Pn≦n holds (step 560). More specifically, the value Pn which, in a case where restoration has been successively performed using encoding contexts of degree 1 or greater, is obtained by adding 1 to the number of times restoration has been successively performed, and the degree n of the currently prevailing encoding context are compared. If Pn≦n holds, it is determined whether n≧1 holds. If n≧1 holds, i.e., if restoration has been performed using encoding contexts of degree 1 or greater, then Pn, which has been saved in the stack register, is incremented (Stack+1→Pn). If n<0 (n=0) holds, then the operation Pn=1 is performed (step 561), after which it is determined whether the restoration of all data has been completed (step 562). If restoration is not finished, the program returns to step 552 so that the above-described processing is repeated with regard to the next source character.

If it is found at step 560 that the relation Pn>n holds, i.e., if the value Pn, which is obtained by adding 1 to the number of times restoration has been successively performed using encoding contexts of degree 1 or greater (if such is the case) is greater than the degree n of encoding context that was used in the current restoration, then the context obtained by connecting this restored character Xt to the context X(t−Pn, t−1) is registered (step 563). More specifically, the character string (context) obtained by connecting this restored character Xt to Pn-number of successive character strings immediately preceding the currently restored character Xt is registered. The processing of steps 560, 563 and 564 is then repeated until the relation Pn≦n is established. It should be noted that registration of new context is not carried out at step 563 from the second cycle of processing onward because encoding context of maximum length will already have been registered the first time step 563 was executed.

Thus, restoration processing and registration of context that prevails when Pn>n holds are carried out. If Pn≦n holds at step 560, sequential registration is carried out in parallel fashion.

(D) Processing for Registering Plurality of Characters as One Character

Figure 13:
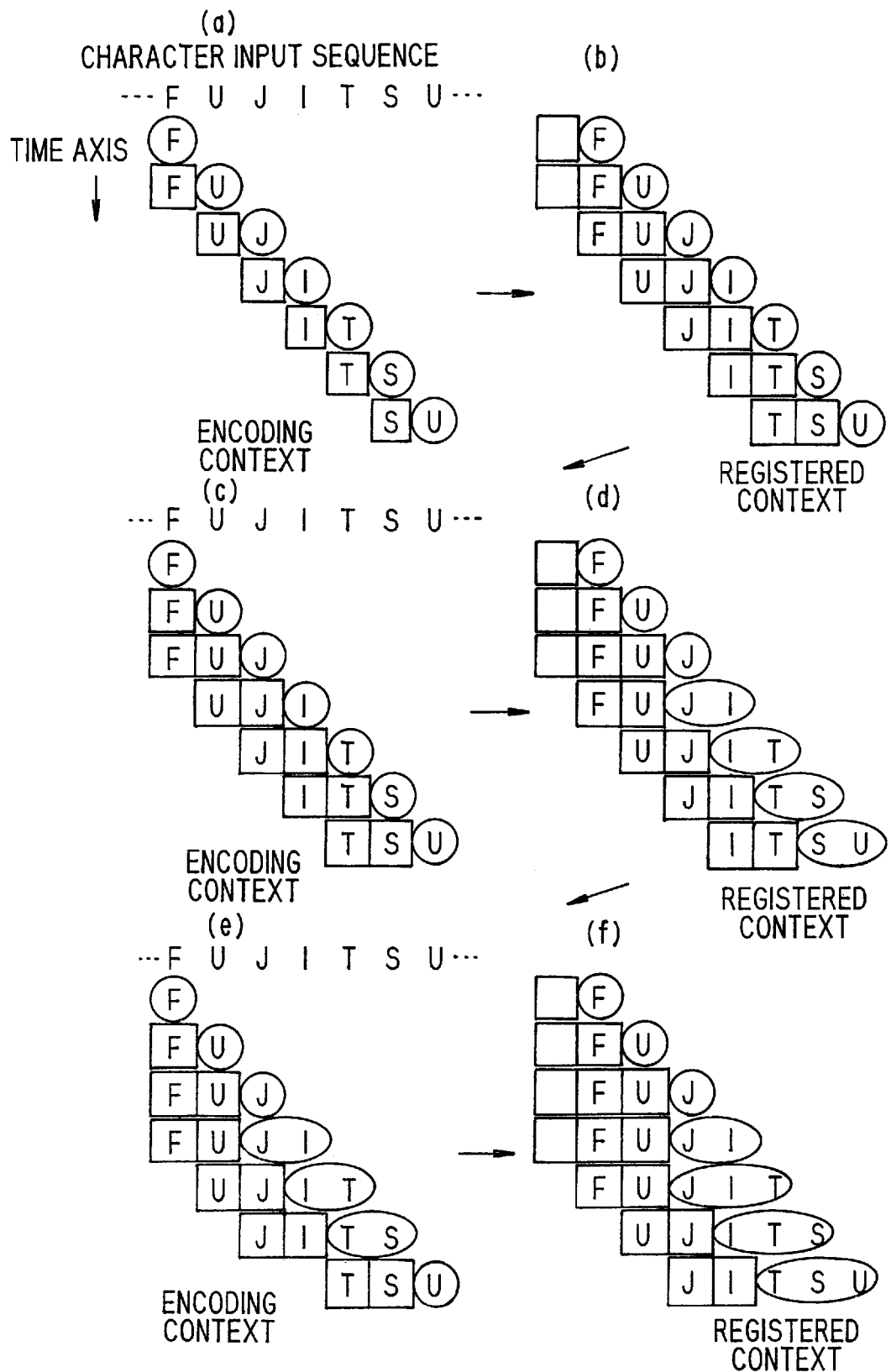
FIG. 13 is a diagram for describing a case where context is registered with a plurality of characters serving as one character.

FIG. 13 is a diagram for describing processing in a case where context is registered with a plurality of characters being regarded as one character. In a case where the correlation between encoding context of a character immediately preceding a source character and encoding context of the source character is strong, context is registered by regarding parts of these encoding contexts, in combination with the source character, as being a single character. More specifically, in a case where the degree of encoding context of a character immediately preceding a source character and the degree of encoding context of the source character are both equal to or greater than a predetermined degree (e.g., degree 2), the immediately preceding character and the source character are combined as a single character and context obtained by connecting the synthesized character to the above-mentioned encoding context is registered.

FIG. 13(a) illustrates contexts (registered contexts) registered by the sequential registration method after the initial character string "FUJITSU" is entered under a condition in which the characters F, U, J, I, T, S, U have been registered as encoding contexts (contexts of degree 0). If the initial character string "FUJITSU" is entered under these conditions, the compressing encoder 13 encodes each input character using the registered contexts in (a) and the context registration unit 12 registers the following contexts by the sequential registration method, as indicated at (b) in FIG. 13:

F
FU
FUJ
UJI
JIT
ITS
TSU

Next, when the character string "FUJITSU" is entered, the compressing encoder 13 performs encoding using the registered contexts shown in (b) of FIG. 13. In this case the contexts (encoding contexts) used in the encoding of the characters J, I, T, S, U are "FUJ", "UJI", "JIT", "ITS" and "TSU", which are contexts of degree 2. When the degree of encoding context of a character immediately preceding a source character and the degree of encoding context of the source character are both equal to or greater than a predetermined degree (e.g., degree 2), the context registration unit 12 combines the immediately preceding character and the source character as a single character and registers context obtained by connecting the synthesized character to the encoding context of the immediately preceding character. As a result, the following contexts are registered, as illustrated in FIG. 13(d):

F
FU
FUJ
FUJI
UJIT
ITSU where two underlined characters are regarded as being one character.

Next, when the character string "FUJITSU" is entered again, the compressing encoder 13 performs encoding using the registered contexts in (d) and the context registration unit 12 combines the immediately preceding character and the source character as a single character and registers context of degree 2 obtained by connecting the synthesized character to the encoding context of the immediately preceding character. As a result, the following contexts are registered, as illustrated in FIG. 13(f):

F
FU
FUJI
FUJI
FUJIT
JITSU

The context registration unit 12 and compressing encoder 13 thenceforth execute compressive encoding and registration of context in similar fashion.

By thus combining characters successively encoded at degree 2 and adopting the combination as one encoded unit, a portion having strong correlation can be handled as a character string. Further, by registering this character string while regarding it as a single character, it is possible to raise compression and restoration speed and to improve encoding efficiency.

Though the foregoing has been described with regard to compressive encoding, codes are restored to characters while registering context in a similar manner at the time of restoration.

(E) Processing for Limiting Search Range of Encoding Context

When compressive encoding is continued, registered contexts become too plentiful and instances arise in which searching encoding contexts becomes time-consuming. Accordingly, a search of indiscriminately long context is not conducted and context is searched by limiting the search to context having a high possibility of use.

(a) First Embodiment

Figure 14:
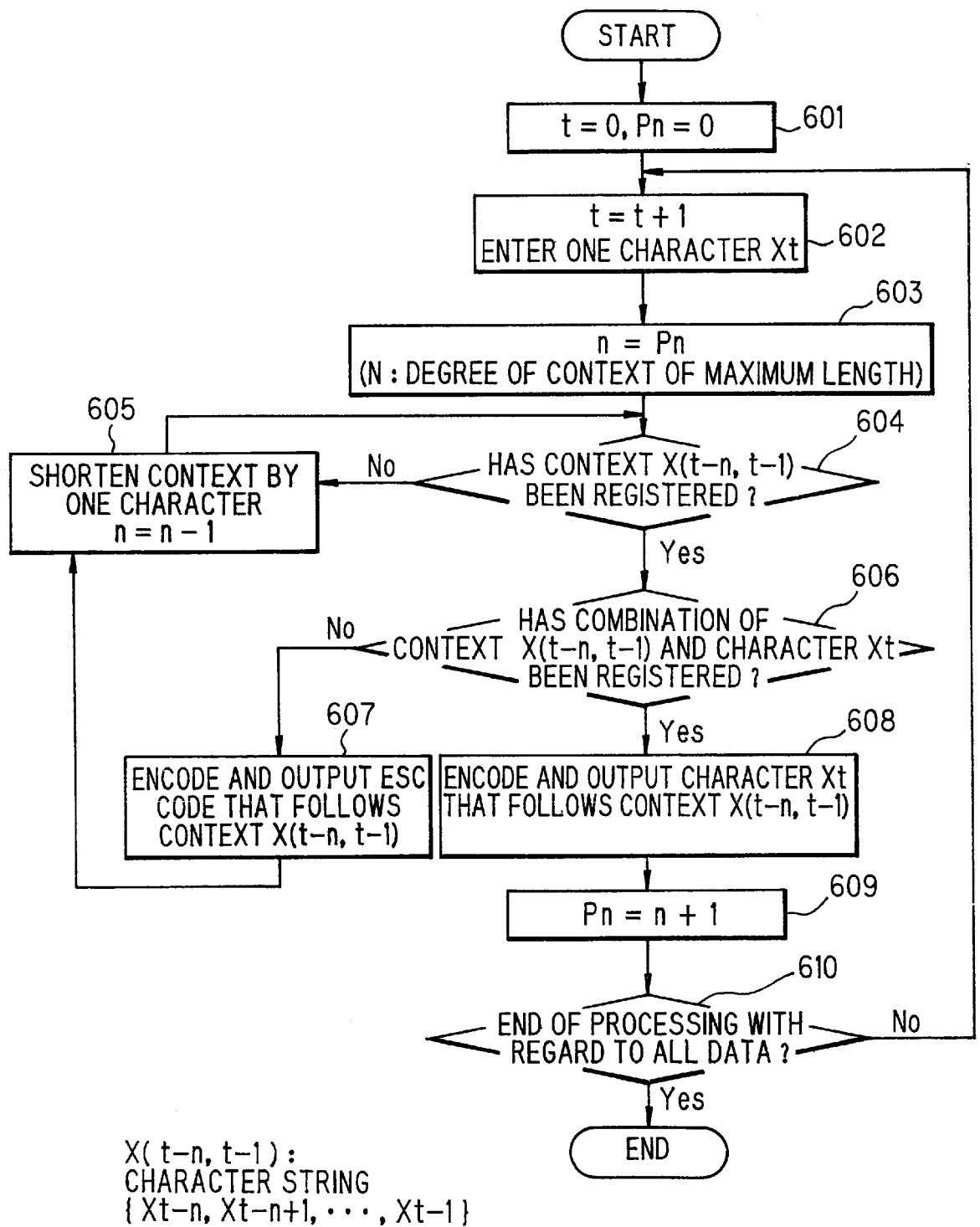
FIG. 14 is a first data compression processing flowchart for a case where the search range of encoding context is limited.

FIG. 14 is a flowchart data compression processing executed by the compressing encoder 13 for a case where the search range of encoding context is limited. In this embodiment, context shorter than context (of degree n), which is obtained by connecting a character immediately preceding encoding context to the encoding context, is adopted as the search range of encoding context.

The first step in the flowchart of FIG. 14 is to initialize a character number t as well as Pn to 0 (step 601), where Pn is obtained by adding 1 to the degree of context (encoding context) that was used in the encoding of the immediately preceding character. Since encoding will have not yet been carried out at the start of processing, Pn is set to 0 at step 601.

Next, the character number t is incremented, a character Xt, which is the t-th character, is entered (step 602), and the degree n is then made Pn (step 603). It should be noted that N represents the degree of context of maximum length.

This is followed by step 604, at which it is determined whether the context X(t−n,t−1) has been registered in a context tree. It should be noted that the context X(t−n,t−1) is a character string {Xt−n, Xt−n+1, . . . , Xt−1}. If the context X(t−n,t−1) has not been registered ("NO" at step 604), the degree n is decremented (step 605) and it is determined whether context shortened by one character has been registered (step 604).

If the context X(t−n,t−1) has been registered ("YES" at step 604), it is determined whether the combination of the context X(t−n,t−1) and source character Xt to be encoded is present in a context tree (step 606). If the combination is not present in the context tree ("NO" at step 606), an escape code (ESC code) that follows the context X(t−n,t−1) is encoded and outputted (step 607), after which processing from step 605 onward is repeated.

If the combination of the context X(t−n,t−1) and the source character Xt is present in the context tree ("YES" at step 606), then the source character Xt is encoded and outputted using the probability that the source character Xt will appear following the context Xt−n, t−1) (step 608). Next, Pn is incremented by the operation Pn=n+1 (step 609) and it is determined whether the encoding of all data has been completed (step 610). If encoding is not finished, the program returns to step 602 so that the above-described processing is repeated with regard to the next source character.

Though registration of context has not been described above, the context registration unit 12 executes context registration processing, in concurrence with the above-described compression processing, in accordance with, e.g., the sequential registration method or the registration method that has already been described.

Thus, context shorter than context (of degree n), which is obtained by connecting a character immediately preceding encoding context to the encoding context, can be adopted as the search range of encoding context. As a result, a search of indiscriminately long context is not conducted and context can be searched by limiting the search to context having a high possibility of use.

Figure 15:
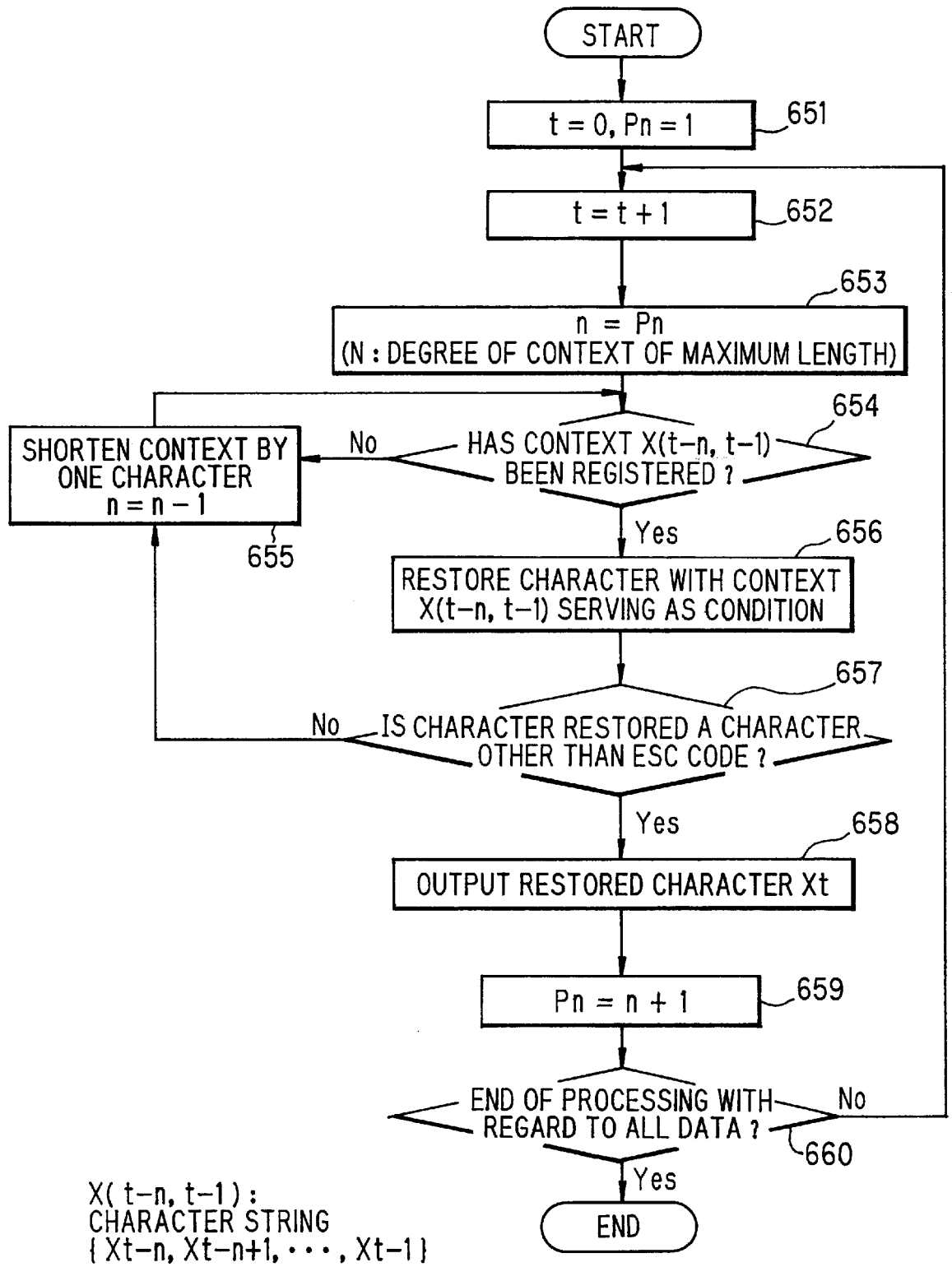
FIG. 15 is a first data restoration processing flowchart for a case where the search range of encoding context is limited.

FIG. 15 is a flowchart of restoration processing executed by the restoration unit 23 for a case where the search range of encoding context is limited.

The first step in the flowchart of FIG. 15 is to initialize the code number t as well as Pn to 0 (step 651), where Pn is obtained by adding 1 to the degree of context (encoding context) that was used in the restoration of the immediately preceding code. Since restoration will have not yet been carried out at the start of processing, Pn is set to 0 at step 651. Next, the code number t is incremented (step 652) and the degree n is made Pn (step 653). It should be noted that N represents the degree of context of maximum length.

This is followed by step 654, at which it is determined whether the context X(t−n,t−1) has been registered in a context tree. It should be noted that the context X(t−n,t−1) is n-number of the latest character strings {Xt−n, Xt−n+1, . . . , Xt−1} already restored.

If the context X(t−n,t−1) has not been registered, the degree n is decremented (step 655) and it is determined whether context shortened by one character has been registered (step 654). If the context X(t−n,t−1) has been registered ("YES" at step 654), the t-th code is restored to a character code with the context X(t−n,t−1) serving as the condition (step 656).

Next, it is determined whether the restored character code is an ESC code (step 657). If the character code is the ESC code, then processing from step 655 onward is repeated. If the character code is not the ESC code, on the other hand, the restored character code is outputted (step 658) and Pn is incremented by the operation Pn=n+1 (step 659). It is then determined whether the restoration of all data has been completed (step 660). If restoration is not finished, the program returns to step 652 so that the above-described processing is repeated with regard to the next code.

Though registration of context has not been described above, the context registration unit 22 executes context registration processing, in concurrence with the above-described restoration processing, in accordance with, e.g., the sequential registration method or the registration method that has already been described.

(b) Second Embodiment

Figure 16:
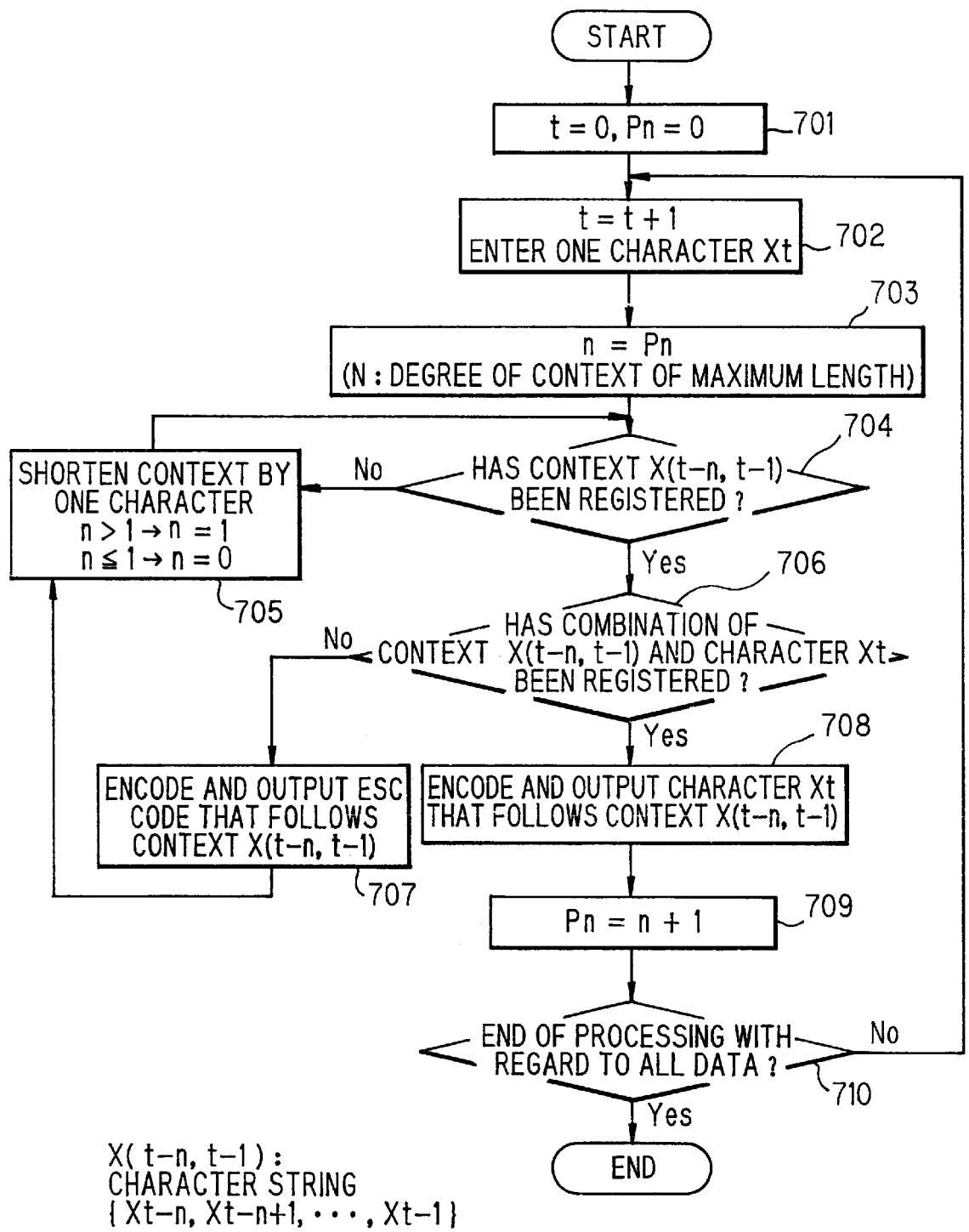
FIG. 16 is a second data compression processing flowchart for a case where the search range of encoding context is limited.

FIG. 16 is a flowchart of compression processing executed by the compressing encoder 13 for a case where the search range of encoding context is limited. In this embodiment, only context which is obtained by connecting a character immediately preceding encoding context to this encoding context, and for which the degree is not greater than degree 1 or is degree 0, is adopted as the object of a search of encoding contexts.

The first step in the flowchart of FIG. 16 is to initialize a character number t as well as Pn to 0 (step 701), where Pn is obtained by adding 1 to the degree of context (encoding context) that was used in the encoding of the immediately preceding character. Since encoding will have not yet been carried out at the start of processing, Pn is set to 0 at step 701.

Next, the character number t is incremented, a character Xt, which is the t-th character, is entered (step 702), and the degree n is then made Pn (step 703). It should be noted that N represents the degree of context of maximum length.

This is followed by step 704, at which it is determined whether the context X(t−n,t−1) has been registered in a context tree. It should be noted that the context X(t−n,t−1) is a character string {Xt−n, Xt−n+1, . . . , Xt−1}. If the context X(t−n,t−1) has not been registered ("NO" at step 704), it is determined whether the degree n is greater than 1. The degree n is made 1 if n>1 holds and is made 0 if n<1 holds (step 705). Processing from step 704 onward is then repeated. More specifically, if context obtained by connecting a character immediately preceding encoding context to this encoding context is not encoding context of the source character, then the degree n is made 1 or 0 and encoding context is searched from contexts of degree 1 or 0.

If the context X(t−n,t−1) has been registered ("YES" at step 704), it is determined whether the combination of the context X(t−n,t−1) and source character Xt is present in a context tree (step 706). If the combination is not present in the context tree ("NO" at step 706), an escape code (ESC code) that follows the context X(t−n,t−1) is encoded and outputted (step 707), after which processing from step 705 onward is repeated.

If the combination of the context X(t−n,t−1) and the source character Xt is present in the context tree ("YES" at step 706), then the source character Xt is encoded and outputted using the probability that the source character Xt will appear following the context Xt−n, t−1) (step 708).

Next, Pn is incremented by the operation Pn=n+1 (step 709) and it is determined whether the encoding of all data has been completed (step 710). If encoding is not finished, the program returns to step 602 so that the above-described processing is repeated with regard to the next source character.

Though registration of context has not been described above, the context registration unit 12 executes context registration processing, in concurrence with the above-described compression processing, in accordance with, e.g., the sequential registration method or the registration method that has already been described.

Thus, only context which is obtained by connecting a character immediately preceding encoding context to this encoding context, and for which the degree is not greater than degree 1 or is degree 0, can be adopted as the object of encoding context. As a result, a search of indiscriminately long context is not conducted and context can be searched by limiting the search to context having a high possibility of use.

Figure 17:
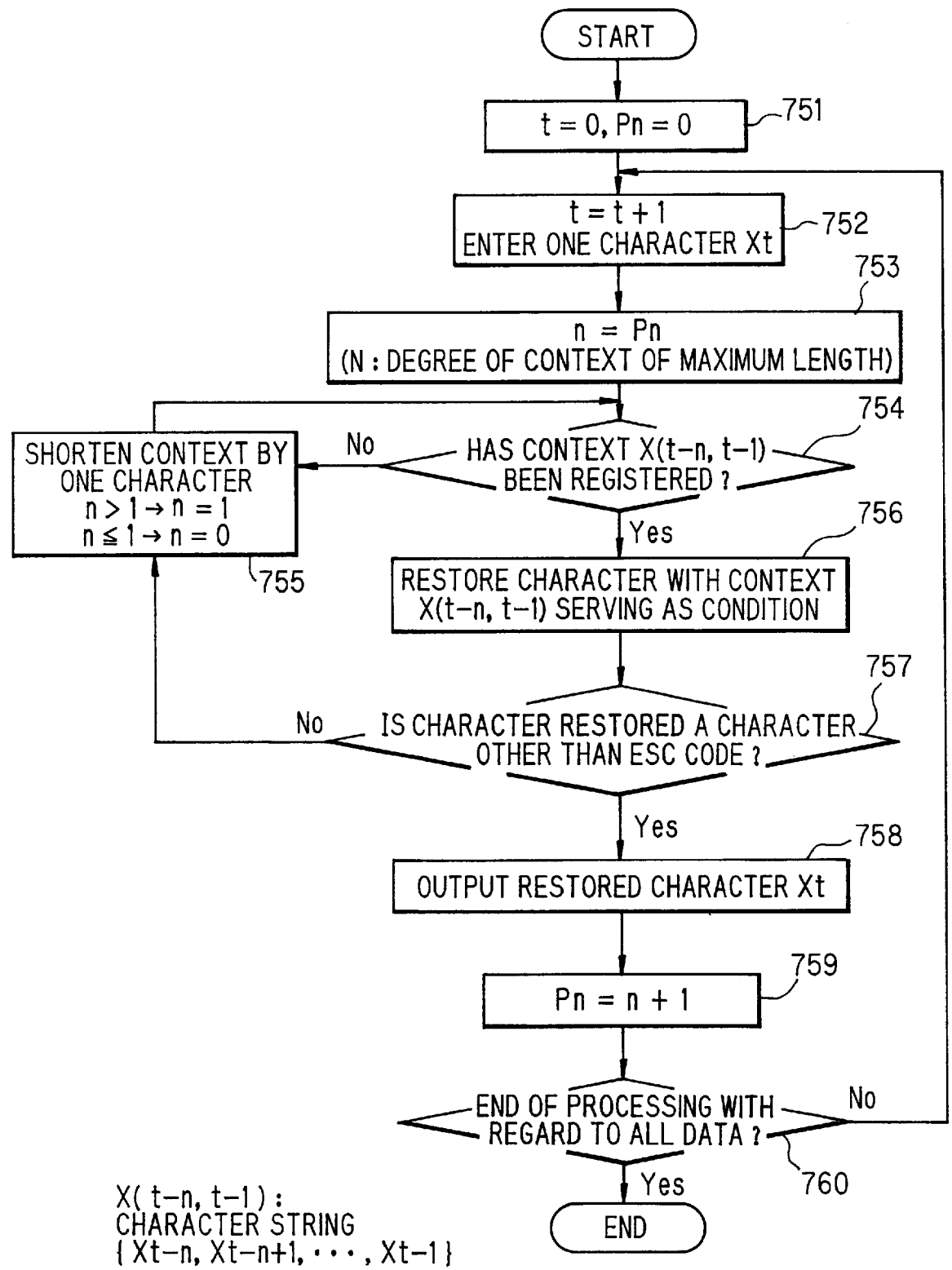
FIG. 17 is a second data restoration processing flowchart for a case where the search range of encoding context is limited.
Figure 18:
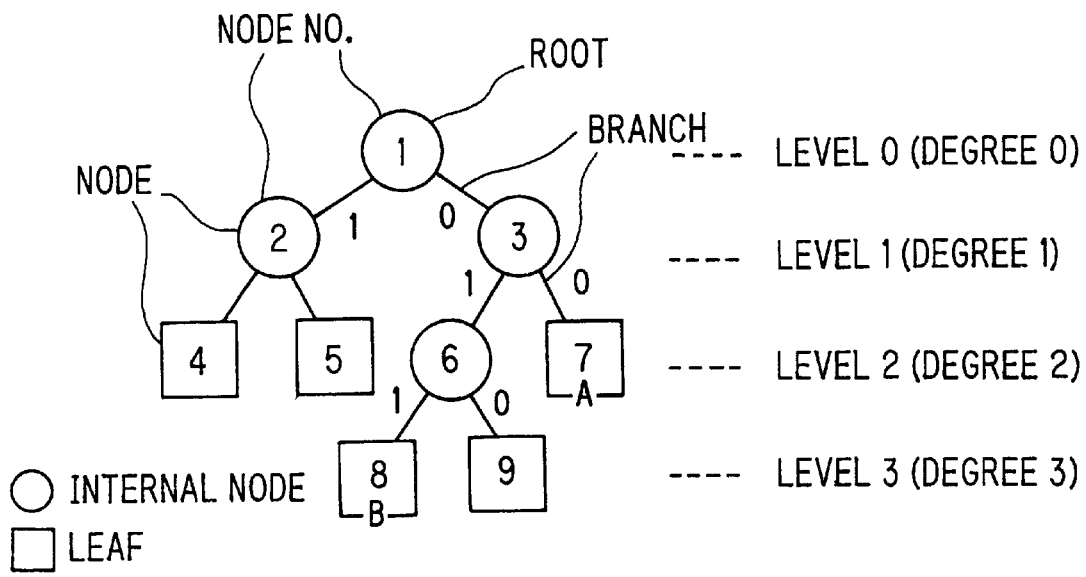
FIG. 18 is a diagram for describing a code tree.
Figure 19:
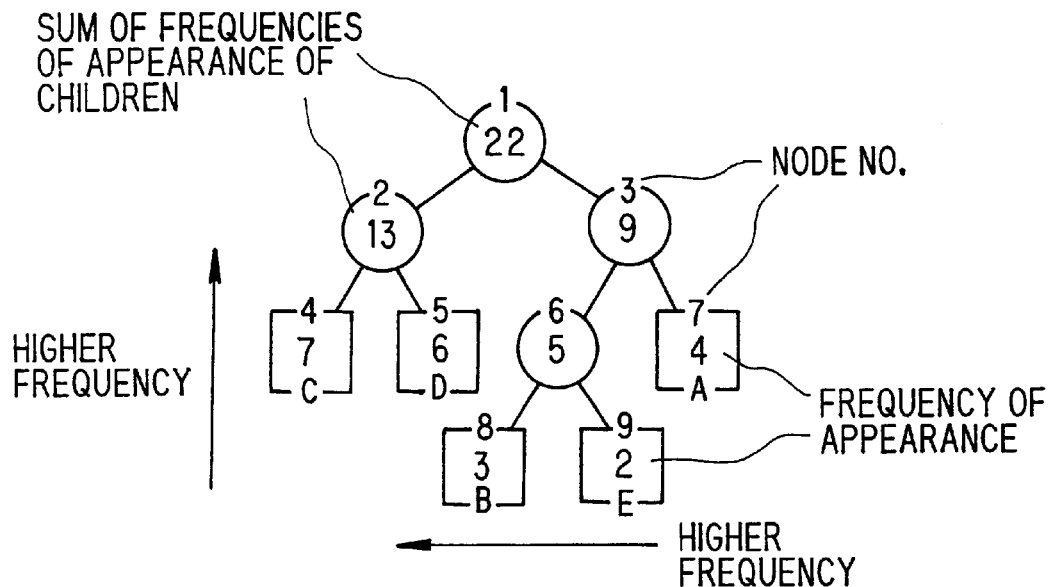
FIG. 19 is a diagram for describing a Huffman code tree.
Figures 20, 21:
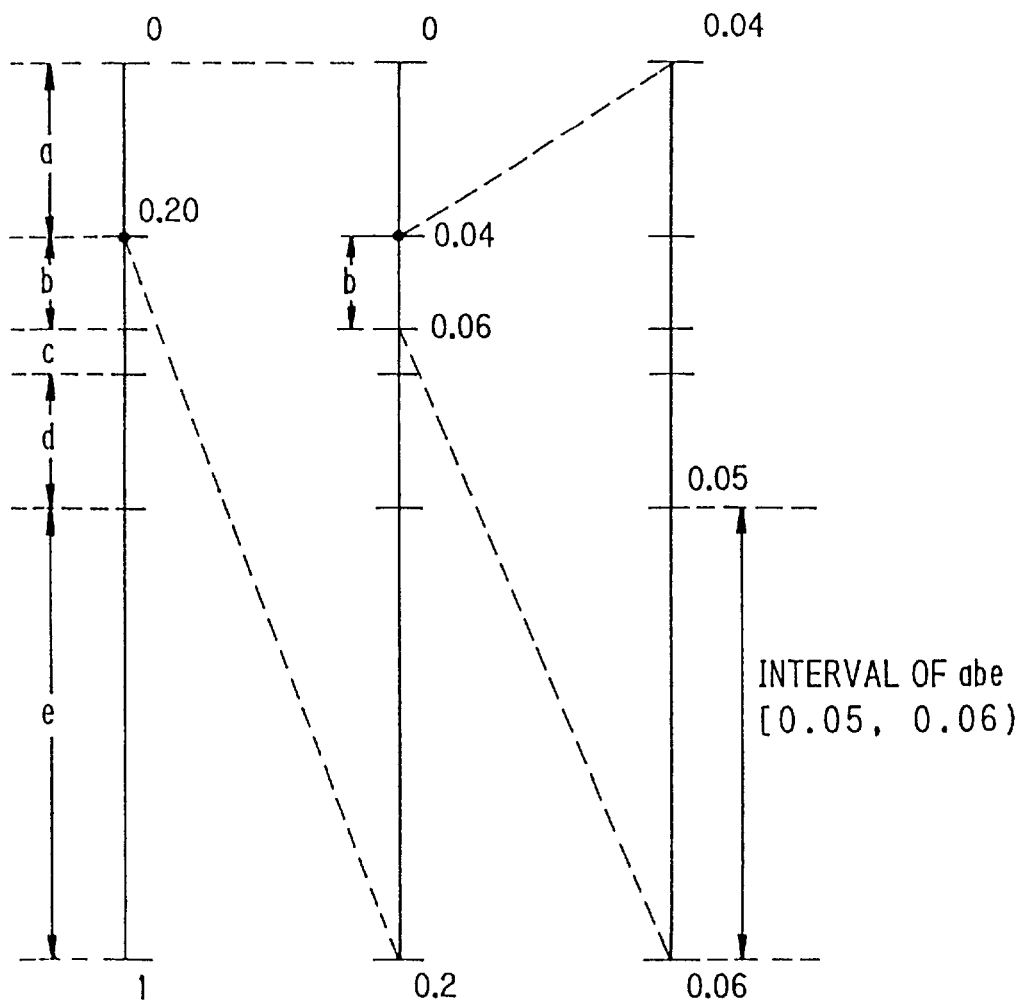
FIG. 20 is a table showing the correspondence among characters, probabilities of occurrence and intervals for the purpose of describing arithmetic coding.
FIG. 21 is a schematic view for describing arithmetic coding.
Figure 22:
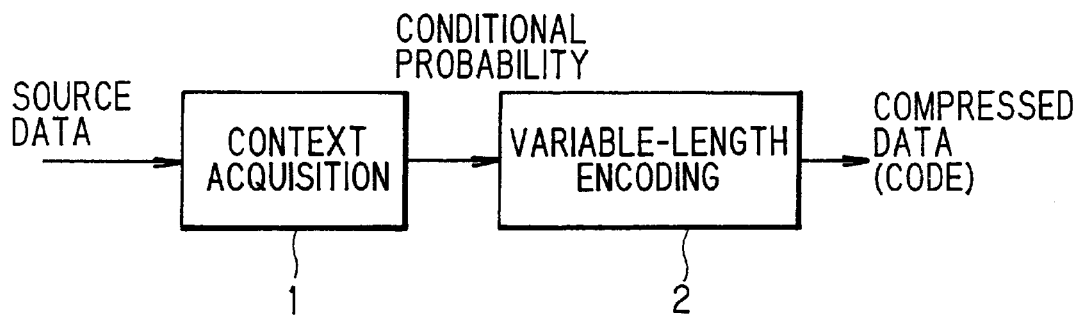
FIG. 22 is a diagram for describing variable-length encoding of a context model.
Figure 23:
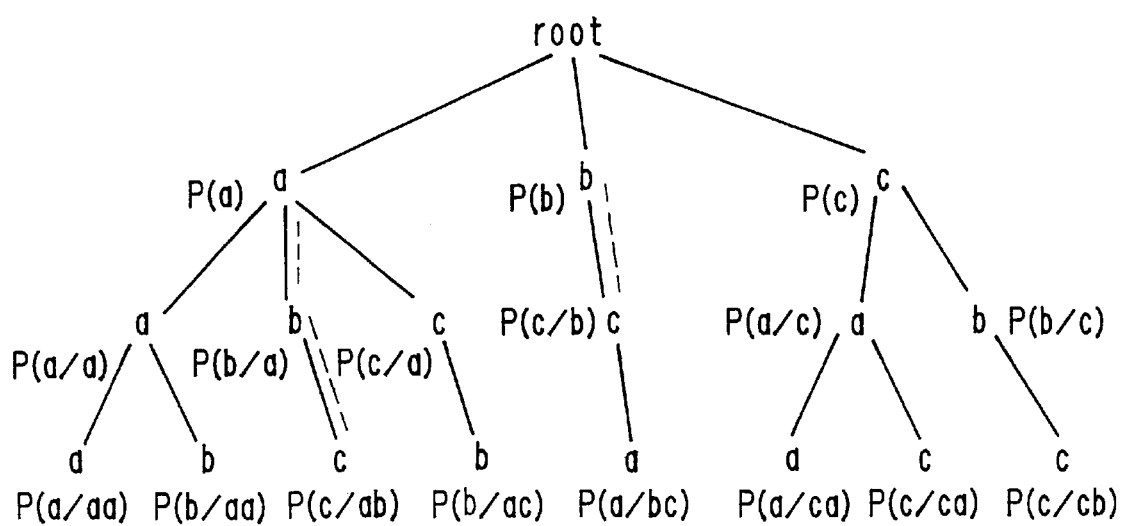
FIG. 23 is an explanatory view illustrating an example of a context tree with conditional probability.
Figure 24:
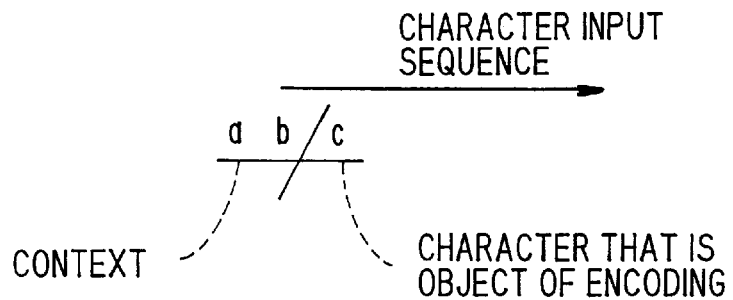
FIG. 24 is a diagram for describing context and source characters.
Figure 25A:
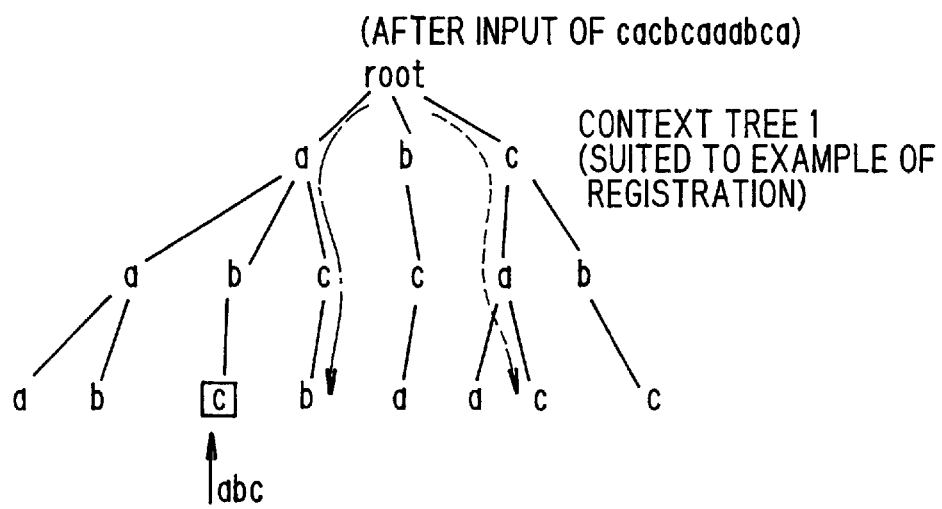
FIGS. 25A, 25B are examples of registration of context trees.
Figure 25B:
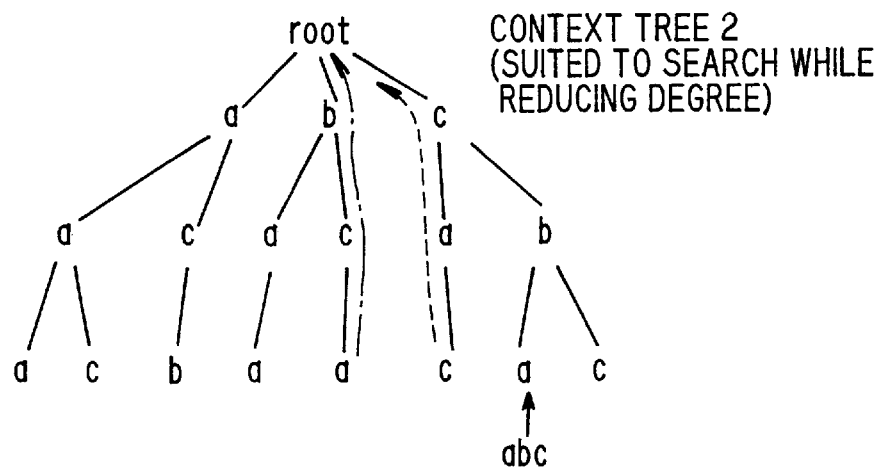
Figure 26:
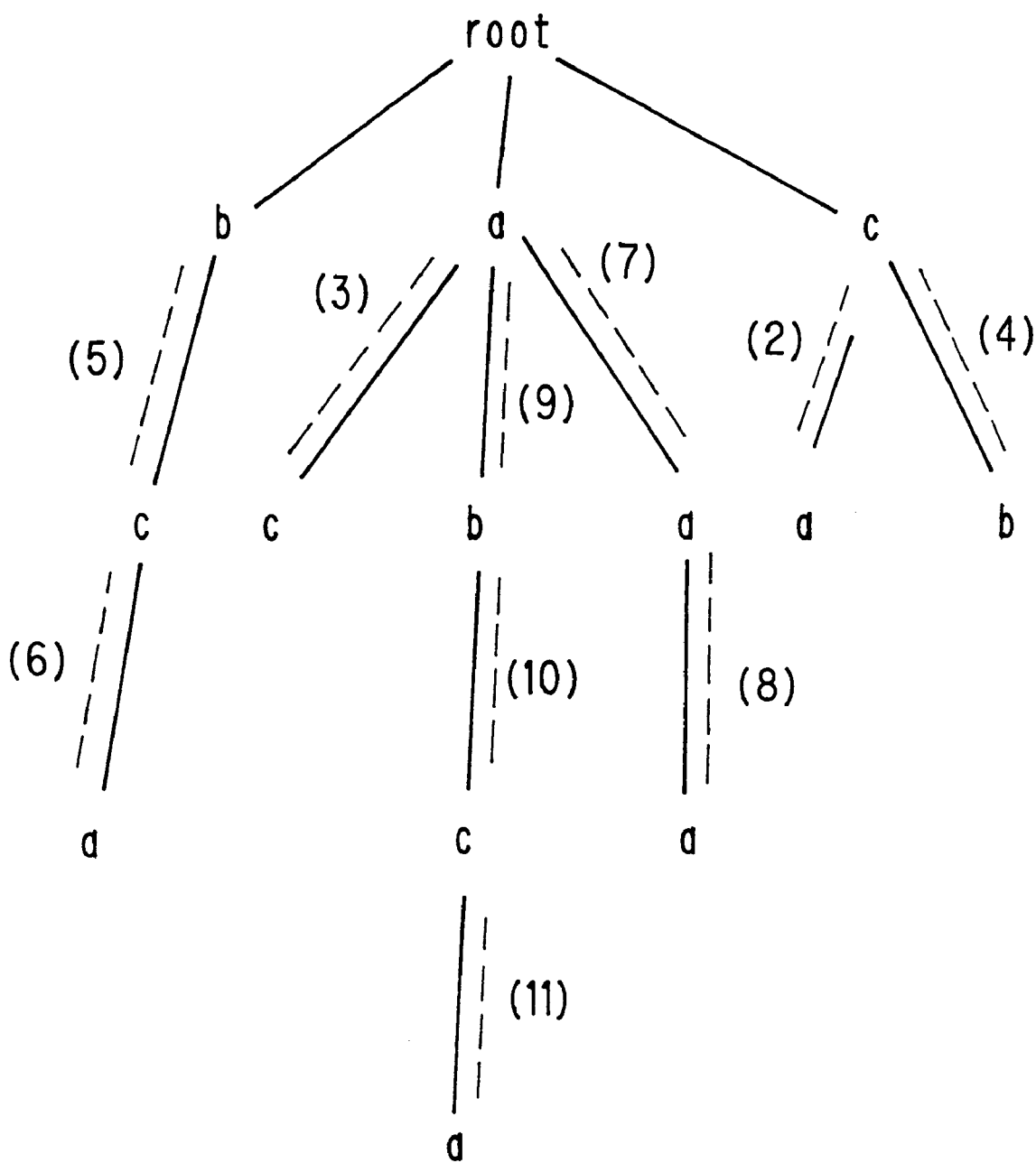
FIG. 26 is an example of sequential registration of a context tree.

FIG. 17 is a flowchart of restoration processing executed by the restoration unit 23 for a case where the search range of encoding context is limited.

The first step in the flowchart of FIG. 17 is to initialize the code number t as well as Pn to 0 (step 751), where Pn is obtained by adding 1 to the degree of context (encoding context) that was used in the restoration of the immediately preceding code. Since restoration will have not yet been carried out at the start of processing, Pn is set to 0 at step 751. Next, the code number t is incremented (step 752) and the degree n is made Pn (step 753). It should be noted that N represents the degree of context of maximum length.

This is followed by step 754, at which it is determined whether the context X(t−n,t−1) has been registered in a context tree. It should be noted that the context X(t−n,t−1) is n-number of the latest character strings {Xt−n, Xt−n+1, . . . , Xt−1} already restored.

If the context X(t−n,t−1) has not been registered, it is determined whether the degree n is greater than 1. The degree n is made 1 if n>1 holds and is made 0 if n≦1 holds (step 755). Processing from step 754 onward is then repeated.

If the context X(t−n,t−1) has been registered ("YES" at step 754), the t-th code is restored to a character code with the context X(t−n,t−1) serving as the condition (step 756).

Next, it is determined whether the restored character code is an ESC code (step 757). If the character code is the ESC code, then processing from step 755 onward is repeated. If the character code is not the ESC code, on the other hand, the restored character code is outputted (step 758).

Next, Pn is incremented by the operation Pn=n+1 (step 759). It is then determined whether the restoration of all data has been completed (step 760). If restoration is not finished, the program returns to step 752 so that the above-described processing is repeated with regard to the next code.

Though registration of context has not been described above, the context registration unit 22 executes context registration processing, in concurrence with the above-described restoration processing, in accordance with, e.g., the sequential registration method or the registration method that has already been described.

Though the present invention has been described on the basis of embodiments thereof, the invention can be modified in various ways in accordance with the gist thereof set forth in the claims and the invention covers all such modifications as fall within the spirit and scope of the invention.

In accordance with the present invention, it is so arranged that registered context satisfying a predetermined condition (e.g., registered context in which the frequency of appearance of context is greater than a fixed value, or registered context in which the frequency of occurrence of a character that often appears among characters that appear following context is greater than a fixed value) is selected as encoding context, and this encoding context is used to variable-length encode a source character or to restore a variable-length code to a character. As a result, encoding context is carefully selected so that meaninglessly long context is not used encoding context. In addition, it is possible to simplify encoding (to raise compression/restoration speed) and to improve compression ratio.

In accordance with the present invention, registered context is carefully selected, based upon encoding context of a character which precedes a source character, when the degree of context is extended and registered in conformity with input data without fixing the length (degree) of context. For example, (1) a character string, which is obtained by adding a character that immediately precedes encoding context used by the immediately preceding character to the encoding context, is adopted as the object of registered context; or (2) if degrees of encoding contexts of characters preceding a source character are successively equal to or greater than degree 1, context, which comprises each of these contexts and the immediately preceding characters, is adopted as the object of registered context; or (3) if encoding of each of m-number of consecutive characters has been performed using encoding context, context, which is obtained by connecting each of the contexts that satisfy the relation $L_1 < L_2 < \ldots < L_m$ (where Lm represents the length of each context), is adopted as the object of registered context. As a result, in accordance with the present invention, only strongly correlated, effective context can be carefully selected and registered, meaninglessly long context is not registered and it is possible to simplify encoding, utilize memory effectively and raise the compression ratio.

In accordance with the present invention, when the degree of context is extended and registered in conformity with input data without fixing the length (degree) of context, registered context is decided, in a case where the correlation between encoding context of an immediately preceding character and encoding context of the source character is strong, by regarding parts of these encoding contexts and the source character in combination as one character. For example, in a case where the degree of the encoding context of the immediately preceding character and the degree of the encoding context of the source character are both greater than a predetermined degree (more specifically, greater than the degree 2), the immediately preceding character and the source character are combined as a single character and context obtained by connecting this synthesized character to the encoding context of the immediately preceding character is registered. As a result, in accordance with the invention, a character string exhibiting strong correlation is not encoded one character at a time; rather, encoding is performed by regarding the character string as a single character. This makes it possible to raise compression/restoration speed and to improve encoding efficiency.

In accordance with the present invention, a limitation is placed upon a search range of encoding context used in order to encode a source character based upon encoding context used by a character preceding the source character. For example, (1) a context having a degree lower than that of context obtained by connecting a character immediately preceding encoding context to this encoding context is adopted as the search range of the encoding context, or (2) only context which is obtained by connecting a character immediately preceding encoding context to this encoding context, and for which the degree is not greater than degree 1 or is degree 0, is adopted as the search range of the encoding context. As a result, the search range of encoding context is limited to strongly correlated, effective context, meaninglessly long context is not used as encoding context and it is possible to simplify encoding and to raise the compression ratio.

As many apparently widely different embodiments of the present invention can be made without departing from the spirit and scope thereof, it is to be understood that the invention is not limited to the specific embodiments thereof except as defined in the appended claims.

What is claimed is:

1. A statistical data compression method for storing a character string (context) as well as a probability of occurrence of a character which appears following the context, and encoding a character to a variable-length code using the probability, comprising the steps of:

extending a number of characters of the context (degree of context) based upon an entered character, and storing the context as well as the probability of occurrence of said context;

selecting a context for encoding one of the entered characters from among the stored contexts satisfying a predetermined condition; and encoding the entered character using the probability of occurrence of said entered character following the selected context, wherein when a frequency of occurrence of said stored context is greater than a predetermined value, it is judged that said predetermined condition is satisfied.

2. A statistical data decompression method for storing a character string (context) as well as a probability of occurrence of a character which appears following the context, and decoding a variable-length code to a character using the probability, comprising the steps of:

extending a number of characters of the context (degree of context) based upon a decoded character, and storing the context as well as the probability of occurrence of said context;

selecting a context for decoding the variable-length code from among the stored contexts satisfying a predetermined condition; and decoding the variable-length code to a character using the probability of occurrence of said character following the selected context, wherein when a frequency of occurrence of an arbitrary character following to the stored context is greater than a predetermined value, it is judged that said stored context satisfies said predetermined condition.

3. A statistical data compression method for storing a character string (context) as well as a probability of occurrence of a character which appears following the context, and encoding a character to a variable-length code using the probability, comprising the steps of:

comparing a number n of characters of the context that is used in encoding of an entered character and a number Pn of characters of the context that was used in encoding of a previous character;

deciding the context to be stored, based upon the context that was used in encoding of the previous character when the number n is smaller than the number Pn;

storing the decided context as well as a probability of occurrence of the entered character which appears following the context; and selecting a prescribed stored context as the context used in encoding of a succeeding entered character and encoding the entered character using the probability of occurrence of said entered character following the selected context.

4. The method according to claim 3, wherein said context (to be stored) consists of a context which was used in encoding of the previous character and said previous character.

5. A statistical data compression method for storing a character string (context) as well as a probability of occurrence of a character which appears following the context, and encoding a character to a variable-length code using the probability, comprising the steps of:

calculating the number of times the degrees of encoding contexts used in encoding previous characters are successively equal to or greater than degree 1;

obtaining Pn by adding 1 to said number;

comparing a number n of characters of the context that is used in encoding of an entered character and the value of Pn;

deciding the context to be stored, based upon the context that was used in encoding of the previous character when the number n is smaller than the value Pn;

storing the decided context as well as the probability of occurrence of the entered character which appears following the context; and selecting a prescribed stored context as the context used in encoding of a succeeding entered character and encoding the character using the probability of occurrence of said entered character following the selected context, wherein in a case where the number of characters of each encoding context used for encoding each previous character is continuously equal to or greater than 1, said context to be stored includes a context comprising each of the contexts and the previous character.

6. The method according to claim 5, wherein if correlation between characters of the encoding context used for encoding said entered character is strong, the probability of occurrence of a combination character obtained by combining parts of the encoding context and said entered character is stored.

7. The method according to claim 5, wherein if the number of characters of the encoding context used for encoding said entered character and the number of characters of the encoding context used for encoding said previous character which precedes said entered character is respectively greater than a predetermined degree, the probability of occurrence of a combination character obtained by combining said entered character and said previous character is stored.

8. The method according to claim 7, wherein said predetermined degree is degree 2.

9. A statistical data decompression method for storing a character string (context) as well as a probability of occurrence of a character which appears following the context, and decoding a variable-length code to the character using the probability, comprising the steps of:

comparing a number n of characters of the context that is used in decoding of the variable-length code and a number Pn of characters of the context that was used in decoding of a previous variable-length code which precedes said variable-length code;

deciding the context to be stored, based upon the context that was used in decoding of the previous variable-length code to a previous character when the number n is smaller than the number Pn;

storing the decided context as well as the probability of occurrence of the character which appears following the context; and selecting a prescribed stored context as the context used in decoding of the variable-length code and decoding the variable-length code to the character using the probability of occurrence of said character following the selected context.

10. The method according to claim 9, wherein said context to be stored includes the context which was used in decoding the various variable-length codes to the previous character and said previous character.

11. A statistical data decompression method for storing a character string (context) as well as a probability of occurrence of a character which appears following the context, and decoding a variable-length code to a character using the probability, comprising the steps of:

calculating the number of times the degrees of decoding contexts used in decoding previous variable-length codes are successively equal to or greater than degree 1;

obtaining Pn by adding 1 to said number;

comparing a number n of characters of the context that is used in decoding an entered variable-length code to a character and the value of Pn;

deciding the context to be stored, based upon a context that was used in decoding the previous variable-length code to a previous character when the number n is smaller than the value Pn;

storing the decided context as well as the probability of occurrence of a decoded character which appears following the context; and selecting a prescribed stored context as the context used in decoding of a succeeding entered variable-length code and decoding the variable-length code using the probability of occurrence of the character following the selected context, wherein when the number of characters of each decoding context used for decoding each variable-length code is continuously equal to or greater than 1, said context to be stored includes a context comprising each of the contexts and the previous decoded character.

12. The method according to claim 11, wherein if correlation between characters of the decoding context used for decoding said entered variable-length code to a character is strong, the probability of occurrence of a combination character obtained by combining parts of the decoding context and said decoded character is stored.

13. The method according to claim 11, wherein if the number of characters of a decoding context used for decoding said entered variable-length code and the number of characters of a decoding context used for decoding said previous variable-length code is respectively greater than a predetermined degree, the probability of occurrence of a combination character obtained by combining said decoded character obtained by decoding the entered variable-length code and said previous decoded character is stored.

14. The method according to claim 13, wherein said predetermined degree is degree 2.

15. A statistical data compression apparatus storing a character string (context) as well as a probability of occurrence of a character which appears following the context, and encoding a character to a variable-length code using the probability, comprising:

a first unit extending a number of characters of the context (degree of context) based upon an entered character, and storing the context as well as the probability of occurrence of said context;

a second unit selecting a context for encoding one of the entered characters from among the stored contexts satisfying a predetermined condition; and a third unit encoding the entered character using the probability of occurrence of said entered character following the selected context;

wherein when a frequency of occurrence of said stored context is greater than a predetermined value, it is judged that said predetermined condition is satisfied.

* * * * *